United States Patent [19]

Kawama et al.

[11] Patent Number: 5,665,607
[45] Date of Patent: Sep. 9, 1997

[54] METHOD FOR PRODUCING THIN FILM SOLAR CELL

[75] Inventors: Yoshitatsu Kawama; Mikio Deguchi; Shigeru Mitsui; Hideo Naomoto; Satoshi Arimoto; Satoshi Hamamoto; Hiroaki Morikawa; Hisao Kumabe, all of Amagasaki, Japan

[73] Assignee: Mitsubishi Denki Kabushiki Kaisha, Tokyo, Japan

[21] Appl. No.: 258,745

[22] Filed: Jun. 10, 1994

[30] Foreign Application Priority Data

Jun. 11, 1993 [JP] Japan .................. 5-140576
Nov. 19, 1993 [JP] Japan .................. 5-290607
Mar. 24, 1994 [JP] Japan .................. 6-053782

[51] Int. Cl.⁶ .................. H01L 31/18; H01L 31/0368
[52] U.S. Cl. .................. 438/64; 136/256; 136/258; 438/97; 438/977
[58] Field of Search .................. 437/2–5, 228, 437/233–234, 966–967, 974; 136/256, 258 PC; 148/DIG. 135; 156/657.1

[56] References Cited

U.S. PATENT DOCUMENTS

| | | | |
|---|---|---|---|
| 3,993,533 | 11/1976 | Milnes et al. | 117/88 |
| 4,227,942 | 10/1980 | Hall | 136/255 |
| 4,255,208 | 3/1981 | Deutscher et al | 437/3 |
| 4,727,047 | 2/1988 | Bozler et al. | 437/89 |
| 4,861,387 | 8/1989 | Matsumoto | 136/256 |
| 5,397,713 | 3/1995 | Hamamoto et al. | 437/4 |

FOREIGN PATENT DOCUMENTS

| | | |
|---|---|---|
| 59-161883 | 9/1984 | Japan . |
| 2-51282 | 2/1990 | Japan . |
| 3-250771 | 11/1991 | Japan . |
| 4-296061 | 10/1992 | Japan . |
| 4-333288 | 11/1992 | Japan . |

*Primary Examiner*—Aaron Weisstuch
*Attorney, Agent, or Firm*—Leydig, Voit & Mayer

[57] ABSTRACT

In a method for fabricating a thin film solar cell, a thin semiconductor film serving as a power generating layer is formed on a substrate via an intermediate layer, a plurality of holes are formed penetrating through the thin semiconductor film and reaching the intermediate layer, and the intermediate layer is etched away through the through-holes, separating the thin semiconductor film from the substrate with high-efficiency. Since stress is hardly applied to the thin semiconductor film during the separation process, cracking and breaking of the semiconductor film is avoided. Further, since the surface of the substrate is maintained in good condition, the substrate can be reused, resulting in a reduction in the production cost.

22 Claims, 24 Drawing Sheets

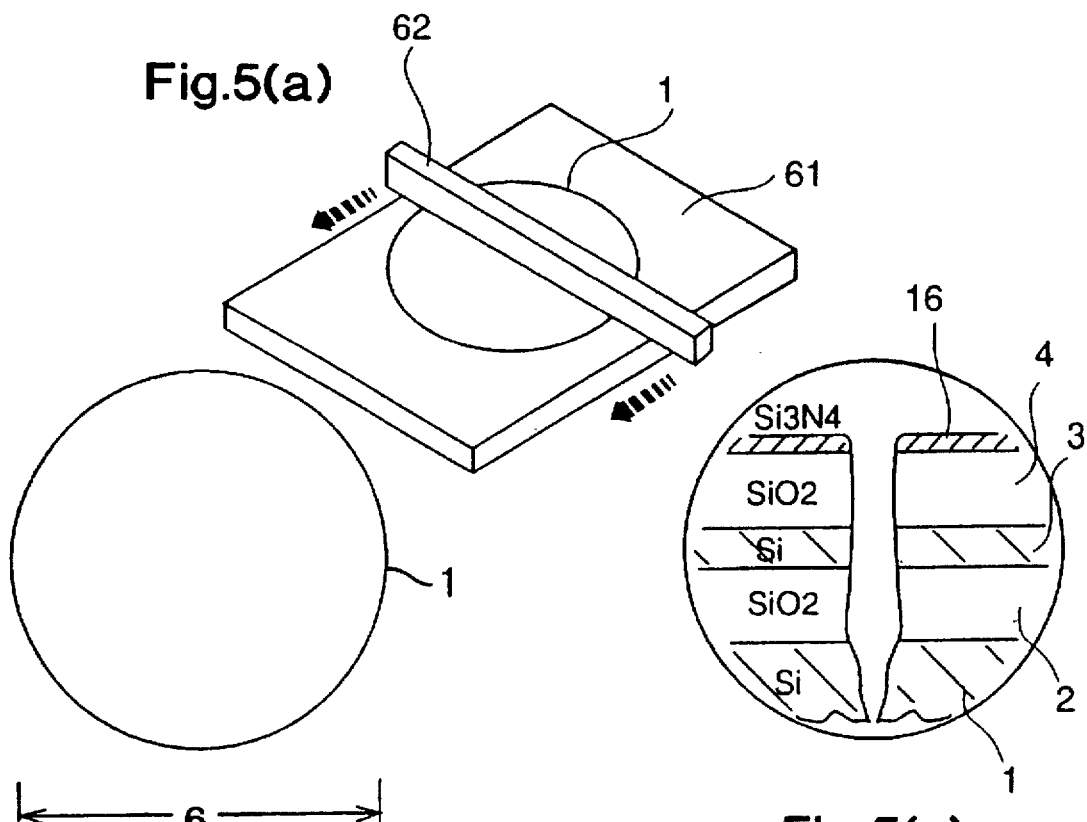
Fig.5(a)
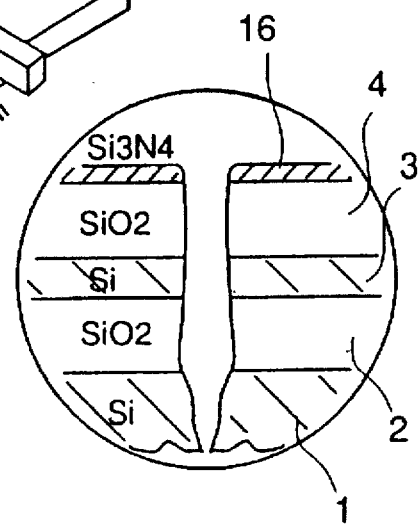
Fig.5(c)
Fig.5(b)
Fig.6
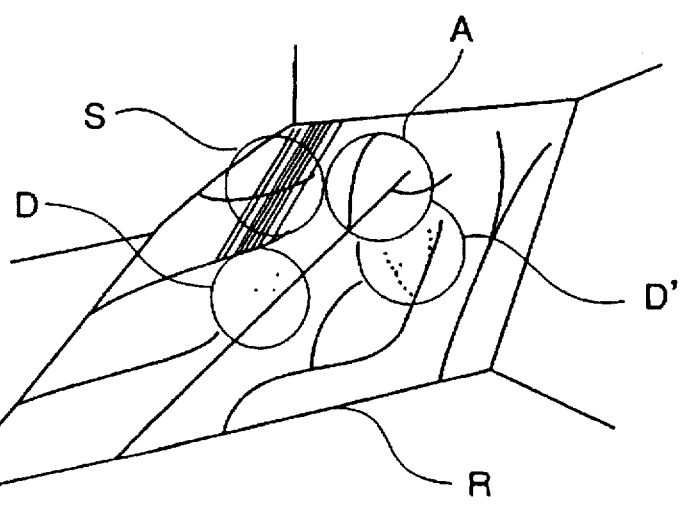

METHOD FOR PRODUCING THIN FILM SOLAR CELL

FIELD OF THE INVENTION

The present invention relates to methods for fabricating thin film solar cells and, more particularly, to techniques of separating a thin semiconductor film serving as a power generating layer of the solar cell from a support substrate and reusing the support substrate to reduce the production cost.

BACKGROUND OF THE INVENTION

In a solar cell comprising crystalline semiconductor material especially, a crystalline silicon solar cell comprising monocrystalline silicon or polycrystalline silicon, it is desirable, that a semiconductor silicon layer serving as a power generating layer be thinner than 100 μm to reduce the production cost and improve the Conversion efficiency. Because of the reduction in the thickness of the power generating layer, the quantity of silicon semiconductor required in the production of the solar cell is reduced, whereby the material cost is reduced. Further, although a conventional solar cell comprising a crystalline silicon wafer is about 500 μm thick, actually 100 μm is enough to absorb solar light. In order to confine incident light in the power generating layer to provide an adequate optical path for long wavelength light, i.e., in order to perform so-called "optical confinement" with high efficiency, the power generating layer is desired to be thinner than 100 μm. In a power generating layer thinner than 100 μm, the minority carriers produced due to incident light are collected with high efficiency, resulting in a solar cell with excellent conversion efficiency.

For the reasons described above, in various institutes, attempts have been made to employ thin semiconductor films, especially, thin crystalline silicon films, in the production of solar cells. Since a thin semiconductor film has poor mechanical strength, usually it is formed on a support substrate. The support substrate must have a heat-resisting property because a high temperature process is employed in the production of the thin semiconductor film. Furthermore, since semiconductors are structure sensitive, addition of impurities in a very small amount causes generation of levels in the forbidden band, whereby electric characteristics vary, resulting in a reduction in the efficiency of the solar cell. Therefore, the support substrate must not-be a supply source of the adverse impurities during the high temperature process. Accordingly, materials satisfying the above-described severe conditions are restricted, and such specific materials are not cheap, so that it is against the purpose of reducing the total cost of the solar cell to employ such specific materials.

Furthermore, techniques of forming the thin semiconductor films have various difficulties. Generally, when a thin semiconductor film is formed on a support substrate comprising a material different from the semiconductor film or coated with that material, a semiconductor film that becomes an amorphous film at a relatively low temperature and becomes a polycrystalline film at a relatively high temperature may be employed as the thin semiconductor film. In this case, however, problems with respect to performance and reliability of completed solar cells remain unsolved. Therefore, in this description, the subject is narrowed to crystalline semiconductor films.

The possibility of growth of a polycrystalline semiconductor film, especially a polycrystalline silicon film, on a material of different kind and the properties of the grown semiconductor film depend on the technique and temperature of the growth process. For example, when CVD (Chemical Vapor Deposition) is employed, a thin polycrystalline silicon film can be grown on a material of any kind. In this case, the grain size of the polycrystalline silicon increases as the growth temperature increases. When performance of the solar cell is considered, it is desirable that the grain size be large. However, the grain size of the polycrystalline semiconductor film grown by CVD is only several microns and, in polycrystalline silicon, this Grain size is not enough to realize a solar cell with high conversion efficiency.

There is an idea that a nucleus for the crystal growth can be produced on the support substrate in advance of the growth of the semiconductor film to increase the grain size. However, this idea is contradictory-to the reduction in the cost of a solar cell. For example there is a technique in which a support substrate comprising a semiconductor material is coated with a material-different from the semiconductor material and an aperture is formed through that coating to expose a part of the substrate that is used as a nucleus for the crystal growth. However, since the support substrate comprises a semiconductor material, this technique is incompatible with the idea of reducing the cost of the solar cell by employing a low-priced material for the support substrate. If a low-purity semiconductor material is used for the support substrate to reduce the material cost, impurities contained in that material adversely affect the performance of the solar cell.

Alternatively, there is a technique called "graphoepitaxy" in which a support substrate comprising a material different from a semiconductor material to be grown on the substrate is employed and a pattern of alternating recesses and projections that triggers the regularity of the grown crystal is produced at the surface of the substrate. In this technique, however, the patterning of alternating recesses and projections increases the production costs.

Furthermore, a solar cell including a thin semiconductor film produced on a support substrate has the following drawbacks. That is, in order to output the current generated in the thin semiconductor film due to incident light, an electrode in ohmic contact with the semiconductor film must be interposed between the semiconductor film and the support substrate. Usually, metal is employed as the material of the electrode. However, if a metal electrode is in direct contact with the semiconductor film during high temperature processing, the metal unfavorably diffuses into the semiconductor film, adversely affecting the characteristics of the semiconductor film. Therefore, it is necessary to output the current through the support substance without using such a metal electrode. That is, the support substrate must have the following characteristics:

1) To support the thin semiconductor film.
2) To make an ohmic contact with the thin semiconductor film.
3) To output the current generated in the thin semiconductor film.
4) Not to supply impurities that adversely affect the characteristics of the thin semiconductor film.

However, in practice, a material satisfying all of these conditions does not exist. This result is attributed to the fact that the support substrate should serve both as a substrate for the formation of the thin semiconductor film and as a back electrode of the solar cell.

In order to fabricate a solar cell economically, after a thin semiconductor film is produced on a support substrate that provides an adequate quality semiconductor film, the support substrate is separated from the semiconductor film and reused. Some specific techniques employing reusable substrates in the production of solar cells have been proposed.

FIGS. 31(a)–31(d) are sectional views illustrating process steps in a prior art method for fabricating a thin film solar cell. In these figures, reference numeral 1 designates a heat-resistant substrate comprising silicon, numeral 3 designates a thin semiconductor film comprising p type silicon, numeral 2 designates an intermediate film, such as a silicon oxide film or a calcium fluoride film, to separate the thin semiconductor film 3 from the substrate 1, numeral 5 designates a junction layer, numeral 6 designates grid electrodes, and numeral 7 designates a back electrode.

Initially, as illustrated in FIG. 31(a), a silicon oxide film 2 or the like is deposited on the surface of the heat resistant substrate 1 by CVD or the like and, thereafter, a p type semiconductor film 3 is deposited on the film 2 by CVD or the like.

In the step of FIG. 31(b), a junction layer 5 is formed by diffusing n type impurities from the surface of the thin semiconductor film 3 or forming an n type microcrystalline film on semiconductor film 3, producing a pn junction.

Thereafter, the semiconductor film 3 is released from the substrate 1 by etching the intermediate film, i.e., the silicon oxide film, 2 with hydrofluoric acid as an etchant, and peeling the semiconductor film 3 from the substrate 1 (FIG. 31(c)). When the intermediate film 2 comprises calcium fluoride, aqueous ammonia is used as the etchant.

Finally, as illustrated in FIG. 31(d), grid electrodes 6 and a back electrode 7 are formed on the junction layer 5 and the rear surface of the semiconductor film 3, respectively, by sputtering of metal, completing a thin film solar cell.

In this production method, if the silicon oxide film 2 is several microns thick and the thin semiconductor film 3 is 10 square centimeters in size, it takes a long time, exceeding 1000 hours, to completely etch the silicon oxide film 2. Therefore, this process is not fit for practical use. When a calcium fluoride film is employed, calcium or other impurity elements contained in that film are unfavorably mixed into the semiconductor film 3, whereby the quality of the semiconductor film 3 is degraded resulting in a thin film solar cell with poor performance.

FIGS. 32(a)–32(e) are sectional views illustrating process steps in a prior art method for fabricating a thin film solar cell disclosed in Japanese Published Patent Application No. Hei. 4-333288. In these figures, reference numeral 1 designates a heat-resistant substrate comprising a silicon wafer, numeral 11 designates an insulating film pattern, such as a silicon oxide film, numeral 12 designates a first silicon layer having a relatively small resistivity, numeral 13 designates a second silicon film having a relatively large resistivity, numeral 14 designates grooves opposite the insulating film pattern 11, numeral 6 designates grid electrodes, and numeral 7 designates a back electrode.

Initially, as illustrated in FIG. 32(a), a pattern of insulating film 11 is formed on the heat-resistant substrate 1. Thereafter a first silicon layer 12 and a second silicon layer 13 are successively epitaxially grown on the substrate 1 where the insulating-film pattern 11 is absent (FIG. 32(b)). Since no silicon layer is grown on the insulating films 11, a plurality of grooves 14 are formed opposite the insulating films 11. Through these grooves 14, the insulating films 11 are etched away with hydrofluoric acid (FIG. 32(c)). Thereafter, as illustrated by arrows, the first silicon layer 12 is selectively etched away through the grooves 14, with a mixture of hydrofluoric acid, nitric acid, and acetic acid, utilizing a difference in etching rates between the first silicon layer 12 and the second silicon layer 13 due to the difference in the resistivities, whereby the second silicon layer 13 is separated from the substrate 1 (FIG. 32(d)). The process of forming a junction layer 5, grid electrodes 6, and a back electrode 7 as shown in FIG. 32(e) is identical to that already described with respect to FIG. 31(d).

In this prior art method, the first silicon layer 12 to be etched away comprises the same material as the heat-resistant substrate 1 and the second silicon layer 13, and the first silicon layer 12 is selectively etched away utilizing the difference in etching rates between the first silicon layer 12 and the second silicon layer 13 due to the difference in resistivities between these layers. Therefore, the resistivity of the second silicon layer 13 is restricted within a narrow range. In addition, the etchant for the first silicon layer 12 is restricted. In this case it is difficult, to obtain excellent characteristics both in the selectivity of the etching and the etching rate. Therefore, although the separation of the second silicon layer 13 is theoretically possible in this prior art method, this method is not fit for practical use. Further, since the first and second silicon layer 12 and 13 and the substrate 1 comprise the same material, it is practically difficult to remove only the first silicon layer 12 without damaging the second silicon layer 13 and the substrate 1. Although the substrate 1 is reusable, it is damaged in each use, so that the practical lifetime of the substrate is limited. As a result, a practical and low-cost production method of thin film solar cells is not achieved.

Furthermore, this prior art method requires a selective epitaxial growth process for the thin semiconductor films, so that the material and the technique are restricted. In addition it is very difficult to reduce the production costs without degrading the quality of the epitaxially grown layer while improving productivity by increasing the growth rate. Accordingly, this prior art method provides poor efficiency and is not applicable to semiconductor devices that require mass production at low cost, such as solar cells.

FIG. 33 is a sectional view for explaining a prior art method of fabricating a thin film solar cell using a graphite sheet, disclosed in Japanese Published Patent Application No. Hei. 4-186083. In the figure, the same reference numerals as in FIGS. 31(a)–31(d) designate the same or corresponding parts. A graphite sheet is employed as the intermediate layer 2 to separate the thin film 3 from the heat-resisting substrate 1.

In this prior art method, in the step of separating the thin semiconductor film 3 from the substrate 1, a mechanical stress is applied to the graphite sheet 2 to cleave the graphite sheet. Since the separation of the semiconductor film 3 and the substrate 1 is mechanically carried out, if the semiconductor film 3 is as thin as several tens of microns and the mechanical strength of that semiconductor film is poor, the semiconductor film 3 unfavorably breaks due to the stress applied during the separation process. Therefore, in this prior art method, it is difficult to produce thin film solar cells at good yield.

U.S. Pat. No. 4,816,420 also discloses a technique of mechanically separating a thin semiconductor film from a substrate. However, this prior art technique provides the above-described problems unless the materials of the thin semiconductor film, the intermediate layer, and the substrate are appropriately selected so that the adhesion of the intermediate layer to the semiconductor film and the substrate is reduced. For example, when the material of the thin semiconductor film is silicon, such as polycrystalline silicon, it is difficult to select appropriate materials satisfying the above-described condition.

The above-described prior art techniques for separating a thin semiconductor film from a support substrate and reusing the support substrate to reduce the production cost have the following drawbacks. That is, the separation of the thin semiconductor film from the support substrate takes a long time. In addition, it is very difficult to separate the semiconductor film from the support substrate without damaging the film or the substrate. Accordingly, a practical process that produces thin film solar cells at low cost is not proposed yet.

Japanese Published Patent Application No. Sho. 59-161883 discloses a technique of etching a thin optical semiconductor film. In this prior art, a photoresist layer 8 formed on an optical semiconductor film 4 is exposed to ultraviolet light through a mask 12 and a transparent base film 7. Since the adhesion between the photoresist layer 8 and the base film 7 is decreased at portions exposed to the ultraviolet light, when the base film 7 is removed from the photoresist layer 8, portions 8a to 8c of the photoresist layer are left on the optical semiconductor film 4. Then, the optical semiconductor film 4 is selectively etched using the photoresist layers 8a to 8c as masks. This prior art relates to a technique for partially removing the photoresist layer to make a plurality of holes in that photoresist layer through which the underlying semiconductor film is selectively etched. Therefore, this technique is not for separating a thin semiconductor film for a solar cell from a substrate.

Japanese Published Patent Application No. Hei. 3-250771 discloses a method of producing a photovoltaic device. In this method, a first transparent electrode 2, a semiconductor optical active layer 3, and a second transparent electrode 4 are successively formed on a substrate 1, and separation grooves 5, 6, and 9 having prescribed depths are formed through the structure, followed by deposition of an electrode layer 10, whereby the structure is divided into a plurality of photovoltaic elements and these photovoltaic elements are connected in series. This prior art relates to a technique for electrically dividing the semiconductor active layer on the substrate with grooves reaching the substrate, but this technique is not for separating the semiconductor active layer from the substrate.

Japanese Published Patent Application No. Hei. 4-296061 discloses a method of producing a photovoltaic device including forming a flexible photovoltaic element on a substrate via a mold release layer, cutting the mold release layer and the photovoltaic element in an island shape, and immersing the substrate in water to separate the photovoltaic element from the substrate at the mold release layer. In this prior art, however, it is premised that a resin layer is interposed between the substrate and a power generating layer. In addition, a portion of the photovoltaic element separated from the substrate is smaller than the photovoltaic element produced on the substrate. Further, a groove determining the portion to be separated must be formed in advance of the cutting.

FIG. 34 is a perspective view illustrating a prior art solar cell disclosed in Japanese Published Patent Application No. Hei. 2-51282. FIG. 35 is a sectional view of a part of the solar cell. In these figures, reference numeral 21 designates a p type semiconductor substrate, numeral 22 designates an n type semiconductor layer, numeral 26 designates an anti-reflection-film, numerals 36 and 37 designate metal electrode layers, numeral 38 designates through-holes, numeral 39 designates a p$^+$ type semiconductor layer, and numeral 40 designates a passivation film.

In this solar cell, the n type semiconductor layer 22 is disposed at the surface of the p type semiconductor substrate 21 to produce a pn junction, and the metal electrodes 36 and 37 are in contact with the n type semiconductor layer 22 and the p type semiconductor substrate 21, respectively. Practically, monocrystalline or polycrystalline silicon is employed as a material of the semiconductor substrate 21. The thickness of the substrate 21 depends on the size of the solar cell. In a solar cell of a practical size, i.e., 10 cm×10 cm, the substrate 21 is about 500 µm thick. It must be at least as thick as 200 µm because a semiconductor substrate thinner than 200 µm does not have adequate mechanical strength and breaks easily. The p$^+$ type semiconductor layer 39 improves the electrical ohmic contact between the semiconductor substrate 21 and the metal electrode 36 and produces a high-low junction with the p type semiconductor substrate 21 that provides a BSF (Back Surface Field) effect.

In this solar cell, light is incident on the surface of the n type semiconductor layer 22 disposed on the front surface of the semiconductor substrate 21. The n type semiconductor layer 22 extends to the rear surface of the substrate 21 along the inner wall of the through-hole 38, and the metal electrode 36 is in contact with the n type semiconductor layer 22 at the rear surface of the substrate 21. In this structure, since no metal electrode is present on the light incident surface, the incident light is effectively used.

In this solar cell, however, since current is transferred to the metal electrode 37 through the thin portion of the n type semiconductor layer 22 at the inner wall of the through-hole 38, the electric resistance at that portion causes a loss, reducing the electric power output from the solar cell. The electric resistance increases as the length of the thin portion of then n type semiconductor layer 22 increases, with an increase in the thickness of the semiconductor substrate 21. The electric resistance can be reduced when the diameter of the through-hole 38 is increased and a thick n type semiconductor layer 22 is formed at the inner wall of the through-hole. In this case, however, the light incident area is significantly reduced by the through-holes even through the metal electrodes 36 and 37 are produced on the rear surface of the semiconductor substrate 21.

SUMMARY OF THE INVENTION

An object of the present invention is to provide a method for producing thin film solar cells in which a thin semiconductor film is separated from a heat-resistant substrate with high efficiency and the heat-resistant substrate is reusable.

Another object of the present invention is to provide a thin film solar cell that has no electrode on its light incident surface and that outputs current generated by incident light without loss.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, in a method for fabricating a thin film solar cell, a thin semiconductor film serving as a power generating layer of a solar cell is formed on a substrate via an intermediate layer, a plurality of holes are produced penetrating through the thin semiconductor film and reaching the intermediate layer, and the intermediate layer is etched away through the through-holes, whereby the thin semiconductor film is separated from the substrate with high efficiency. Since stress is hardly applied to the semiconductor film during the separation process, cracking or breaking of the semiconductor film is prevented. Since the surface of the substrate is maintained in good condition, the substrate can be reused, resulting in a reduction in the production cost of the solar cell.

According to a second aspect of the present invention, in a method for fabricating a thin film solar cell, a substrate including a plurality of through-holes at prescribed positions is prepared, an intermediate layer is formed on the substrate so that the through-holes are covered with the intermediate layer, a thin semiconductor film is formed on the intermediate layer, and the intermediate layer is etched away through the through-holes, whereby the thin semiconductor film is separated from the substrate. Therefore, the same effects as described above are achieved. In addition, since it is not necessary to form through-holes in the semiconductor film, the production process is simplified. As a result, the producibility is further improved and the production cost is further reduced, compared to the above-described method.

According to a third aspect of the present invention, an a method for fabricating a thin film solar cell, a substrate including a plurality of through-holes at prescribed positions is prepared, an intermediate layer and a thin semiconductor film are successively formed on the substrate so that the through-holes are not covered with the intermediate layer and thin semiconductor film, and the intermediate layer is etched away through the through-holes penetrating the substrate, the intermediate layer, and the thin semiconductor film, whereby the thin semiconductor film is separated from the substrate. Therefore, the same effects as described above are achieved. In addition, since the intermediate layer is etched away through the holes penetrating through both the substrate and the semiconductor film, the time required for the separation of the semiconductor film from the substrate is reduced, resulting in a reduction in the production cost of the solar cell.

According to a fourth aspect of the present invention, in a method for fabricating a thin film solar cell, after the separation of the thin semiconductor film from the substrate, a junction region is produced at the entire surface of the thin semiconductor film including the internal surfaces of the through-holes, portions of the junction region at upper or lower surface of the thin semiconductor film are selectively removed leaving portions in the vicinity of the through-holes, and electrodes are formed on the surface of the thin semiconductor film where the junction region is partially removed, in electrical contact with the remaining portions of the junction region. Therefore, the junction region formed at the upper or lower surface of the semiconductor film can be connected to the lower or upper surface of that film through the through-holes, without producing additional through-holes for the electrical contact. Therefore, a thin film solar cell with no electrode on its light incident surface is produced with high efficiency.

According to a fifth aspect of the present invention, in a method for fabricating a thin film solar cell, after the formation of the through-holes, portions of the intermediate layer in the vicinity of the through-holes are etched away, junction regions are formed at the upper surface of the thin semiconductors film, at the internal surfaces of the through-holes, and at portions of the lower surface of the thin semiconductor film exposed by the removal of the intermediate layer and, after the separation of the thin semiconductor film from the substrate, electrodes are formed on the lower surface of the thin semiconductor film, in electrical contact with the junction region. Therefore, the same effects as described above are achieved. In addition, since the junction region is produced when the semiconductor film is not separated from the substrate, the handling of the semiconductor film is facilitated when the junction region is produced. Further, the patterning of the junction region is dispensed with and the production process is further simplified.

According to a sixth aspect of the present invention, in a method for fabricating a thin film solar cell, the thin semiconductor film is formed so that it has a high impurity dopant concentration region at the lower surface, and first and second electrodes comprising the same electrode metal are produced simultaneously on the lower surface of the thin semiconductor film so that the first electrodes are in electrical contact with the junction region and the second electrodes are in electrical contact with the high impurity dopant concentration region. Therefore, in addition to the above-described effects, the electrode formation process is simplified compared to the above-described methods.

According to a seventh aspect of the present invention, in a method for fabricating a thin film solar cell, the thin semiconductor film is produced by successively forming a first semiconductor film of a first conductivity type serving as a junction layer and a second semiconductor film of a second conductivity type, opposite the first conductivity type, on the intermediate layer. After the formation of the through-holes, junction regions are produced at the upper surface of the thin semiconductor film and at the internal surfaces of the through-holes. After the separation of the thin semiconductor film from the substrate, the first semiconductor film is etched leaving portions in the vicinity of the through-holes, and electrodes are produced in contact with the remaining portions of the first semiconductor film. Therefore, an adequately thick junction layer is produced on the lower surface of the semiconductor film with high reliability, improving the production yield.

According to an eighth aspect of the present invention, in a method for fabricating a thin film solar cell, the first conductivity type first semiconductor film is produced with high impurity dopant concentration, and first and second electrodes comprising the same electrode metal are produced simultaneously on the first surface of the thin semiconductor film so that the first electrodes are in electrical contact with the remaining portions of the first semiconductor film and the second electrodes are in electrical contact with the second semiconductor film. Therefore, in addition to the above-described effects, the electrode formation process is simplified compared to the above-described methods.

According to a ninth aspect of the present invention, in a method for fabricating a thin-film solar cell, a first semiconductor film of a first conductivity type having projections through which the through-holes are to be produced and a second semiconductor film of a second conductivity type are successively produced on the intermediate layer so that portions of the first semiconductor film beneath the projections remain the first conductivity type while other portions are converted to the second conductivity type, whereby a thin semiconductor film in which the first conductivity type portions of the first semiconductor film serve as junction regions is formed. After the formation of the through-holes, junction regions are produced at the upper surface of the thin semiconductor film and at the internal surfaces of the through-holes. After the separation of the thin semiconductor film from the substrate, electrodes are produced on the lower surface of the thin semiconductor film, in electrical contact with the junction regions. Therefore, the same effects as described above are achieved. In addition, since the above-described process of partially removing the first conductivity type first semiconductor film after the separation of the semiconductor film is dispensed with, the production process is simplified According to a tenth aspect of the present invention, in a method for fabricating a thin film solar cell, the fit conductivity type first semiconductor film is formed with a high impurity dopant concentration, and first and second electrodes comprising the same electrode metal are produced simultaneously on the lower surface of the thin semiconductor film so that the first electrodes are in electrical contact with the first conductivity type portions of the first semiconductor film and the second electrodes are in electrical contact with the second conductivity type portions of the first semiconductor film. Therefore, in addition to the above-described effects, the electrode formation process is simplified compared to the above-described methods.

According to an eleventh aspect of the present invention, in a method for fabricating a thin film solar cell, before the formation of the electrodes, the thin semiconductor film is adhered to a transparent substrate using an adhesive sheet. The adhesive sheet comprises a transparent resin having a viscosity exceeding 10000 P when it is softened by heat and it is cured immediately after thermal softening. Therefore, even when the softened adhesive sheet is pressed by the semiconductor film and the transparent substrate, the adhesive sheet maintains its shape and never reaches the lower surface of the semiconductor film, i.e., the electrode formation surface, through the through-holes.

According to a twelfth aspect of the present invention, in a method for fabricating a thin film solar cell, the above-described adhesive sheet is disposed on the transparent substrate that is heated to a temperature exceeding the softening point of the adhesive sheet and, thereafter, the thin semiconductor film that is heated to a temperature higher than the softening point of the adhesive sheet is disposed on the adhesive sheet so that the upper surface where electrodes are not to be produced is in contact with the adhesive sheet, whereby the thin semiconductor film is fixed on the transparent substrate via the adhesive sheet. Therefore in the adhering process, only a portion of the adhesive sheet in contact with the semiconductor film is softened, so that the shape of the adhesive sheet is maintained. As a result, the unwanted flow of the adhesive toward the electrode formation surface is prevented with higher reliability compared to the above-described method.

According to a thirteenth aspect of the present invention, in a method for fabricating a thin film solar cell, before formation of electrodes, linear or bead-shaped spacers are disposed on a transparent substrate and a transparent adhesive is applied over the substrate. Before formation of electrodes, the thin semiconductor film is disposed on the transparent adhesive so that the upper surface where electrodes are not to be produced is in contact with the transparent adhesive. Therefore, even when the transparent substrate and the thin semiconductor film are pressed toward the transparent adhesive, the space between the transparent substrate and the semiconductor film is not narrower than the height of the spacers, so that a stress that makes the adhesive flow toward the electrode formation surface of the semiconductor film through the through-holes is not applied to the adhesive.

According to a fourteenth aspect of the present invention in a method for fabricating a thin film solar cell, before formation of electrodes, the thin semiconductor film is adhered to a transparent substrate using a transparent adhesive. The transparent substrate has a surface on which a periodic pattern of stripe-shaped grooves is produced. Therefore, when the transparent substrate and the thin semiconductor film are pressed toward the transparent adhesive, the adhesive enters in the stripe-shaped grooves, whereby the unwanted flow of the adhesive toward the electrode formation surface of the semiconductor film through the through-holes is prevented.

According to a fifteenth aspect of the present invention, in a method for fabricating a thin film solar cell, before formation of electrodes, the thin semiconductor film is adhered to a transparent substrate using a transparent adhesive. The thin semiconductor film has a periodic pattern of stripe-shaped grooves at the upper surface where electrodes are not to be produced. Therefore, when the transparent substrate and the thin semiconductor film are pressed toward the transparent adhesive, the adhesive enters the stripe-shaped grooves, whereby the unwanted flow of the adhesive toward the electrode formation surface of the semiconductor film through the through-holes is prevented.

According to a sixteenth aspect of the present invention, in a method for fabricating a thin film solar cell, before formation of electrodes an adhesive tape is applied to the lower surface of the thin semiconductor film where electrodes are to be produced, covering openings of the through-holes, and the thin film solar cell is adhered to a transparent substrate using a transparent adhesive with the upper surface in contact with the adhesive. Therefore, even when the transparent substrate and the thin semiconductor film are pressed toward the transparent adhesive, the adhesive tape prevents the adhesive sheet from protruding onto the electrode formation surface of the semiconductor film.

According to a seventeenth aspect of the present invention, in a method for fabricating a thin film solar cell, before formation of electrodes, a thin film of a transparent adhesive having a viscosity lower than 15 P is evenly applied to a transparent substrate, and the thin semiconductor film is disposed on the transparent adhesive so that the upper surface where electrodes are not to be produced is in contact with the adhesive. Therefore, the quantity of the adhesive can be controlled so that it does not protrude onto the electrode formation surface of the semiconductor film through the through-holes.

According to an eighteenth aspect o the present invention, in a method for fabricating a thin film solar cell, the thin semiconductor film is produced by forming a polycrystalline silicon film and zone-melting and recrystallizing the polycrystalline silicon film. Therefore, a polycrystalline silicon film having increased grain size and uniform resistivity is produced as a power generating layer of a solar cell.

According to a nineteenth aspect of the present invention, in a method for fabricating a thin film solar cell, a first silicon oxide film as the intermediate layer, a thin polycrystalline silicon film as the thin semiconductors film, a second silicon oxide film, and a silicon nitride film are successively formed on the substrate, and the thin polycrystalline silicon film is subjected to zone-melting recrystallization. Therefore, in addition to the above-described effects, the adhesion between the polycrystalline silicon film and the silicon oxide film is improved during zone-melting recrystallization, whereby the quality of the polycrystalline silicon film is further improved.

According to a twentieth aspect of the present invention, a thin film solar cell comprises a thin semiconductor film having opposite front and rear surfaces and a plurality of through-holes, each through-hole having opposite first and second openings at the front and rear surfaces of the thin semiconductor film, respectively, a junction region disposed at the front surface of the thin semiconductor film, at the internal surfaces of the through-holes and at portions of the rear surface of the thin semiconductor film in the vicinity of the through-holes, first electrodes disposed on the rear surface of the thin semiconductor film, in electrical contact with the junction region, and second electrodes disposed on the rear surface of the thin semiconductor film, in electrical contact with the thin semiconductor film where the junction region is absent. In this structure, since no electrode is present on the light incident surface, the loss of incident solar light is reduced. Further, since the junction region of the semiconductor film at the internal surface of the through hole has a relatively small resistivity, the output power is obtained with high efficiency.

According to a twenty-first aspect of the present invention, in the thin film solar cell, the first opening of the through-hole at the front surface of the semiconductor film is larger than the second opening at the rear surface of the semiconductor film. Therefore, the internal surface of the through-hole is also irradiated with solar light, whereby the loss of the light incident area is significantly reduced.

According to a twenty-second aspect of the present invention, in the thin film solar cell, the second opening of the through-hole at the rear surface of the semiconductor film is larger than the first opening at the front surface of the semiconductor film, and the first electrode covers the junction region at the internal surface of the through-hole. Therefore, current flowing in the junction region is transferred to the first electrode without passing through the junction region at the internal surface of the through-hole, whereby the output power is taken out with high efficiency.

According to a twenty-third aspect of the present invention, in the thin film solar cell, the junction region at the rear surface of the thin semiconductor film is a high impurity dopant concentration region. Therefore, the electrical contact between the first electrode and the junction region is achieved by improved ohmic contact, whereby the output power is taken out with high efficiency.

According to a twenty-fourth aspect of the present invention, in the thin film solar cell, the thin semiconductor film includes a high impurity dopant concentration region at the rear surface. Therefore, the electrical contact between the first electrode and the junction region is achieved with an improved ohmic contact, whereby the output power is taken out with high efficiency.

According to a twenty-fifth aspect of the present invention, in the thin film solar cell, the thin semiconductor film is adhered to a transparent substrate via a transparent adhesive, with the front surface in contact with the adhesive. Therefore, the mechanical strength of the thin semiconductor film is increased and the durability of the solar cell is improved.

BRIEF DESCRIPTION OF THE DRAWINGS

FIG. 5(a) is a perspective view for explaining a zone-melting recrystallization of a thin semiconductor film, FIG. 5(b) illustrates a semiconductor wafer, and FIG. 5(c) illustrates the structure of layers disposed on the semiconductor wafer.

FIG. 6 is a model illustrating crystal defects in the thin semiconductor film after the zone-melting recrystallization process.

DETAILED DESCRIPTION OF THE PREFERRED EMBODIMENTS

Figure 1A:
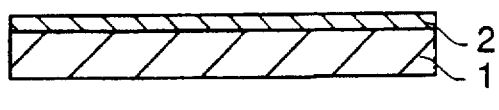
FIGS. 1(a)–1(g) are sectional views illustrating process steps in a method for fabricating a thin film solar cell in accordance with a first embodiment of the present invention.

FIGS. 1(a)–1(g) are sectional views illustrating process steps in a method for producing thin film solar cells in accordance with a first embodiment of the present invention. In these figures, reference numeral 1 designates a heat-resistant substrate, such as a monocrystalline silicon wafer, numeral 3 designates a thin semiconductor film, such as a p type polycrystalline silicon film, numeral 2 designates an intermediate layer, such as a silicon oxide film, separating the thin semiconductor film 3 from the substrate 1, numeral 4 designates a cap layer, such as a silicon oxide film, numeral 5 designates an n type junction layer, numeral 6 designates grid electrodes, and numeral 7 designates a back electrode.

A description is now given of the production process.

Initially, a silicon oxide film 2 is deposited on the heat-resistant substrate 1 by CVD or the like (FIG. 1(a)).

Figure 1B:
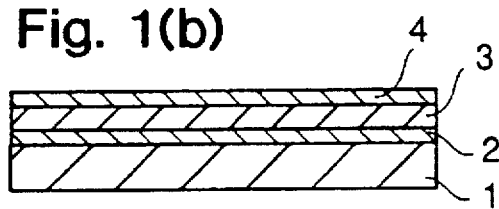
Figure 1C:
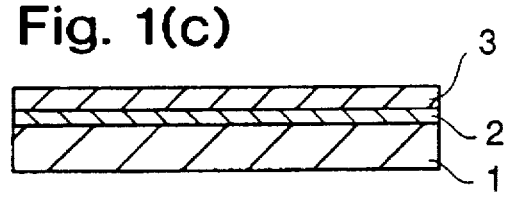

Thereafter, a thin semiconductor film 3, such as a p type polycrystalline silicon film containing a p type impurity dopant, such as boron, at a concentration of $1 \times 10^{16} \sim 10^{17}$ cm$^{-3}$ is deposited on the silicon oxide film 2 and, successively, a cap layer 4, such as a silicon oxide film, is deposited on the semiconductor film 3, preferably by CVD (FIG. 1(b)). The heat-resistant substrate 1 may comprise materials other than monocrystalline silicon, for example, ceramic, refractory metal, quartz glass, and sapphire. However, when the quality of the grown semiconductor film 3 and the handling of that film processing are considered, it is desirable that the semiconductor film 3 and the heat-resistant substrate 1 comprise the same material and have the same physical constants, such as thermal expansion coefficient and thermal conductivity, and the same chemical properties, such as resistance to etching. Further, the heat-resistant substrate 1 must have sufficient mechanical strength to support the thin semiconductor film 3. If the heat-resistant substrate 1 comprises materials other than monocrystalline silicon, the strength of the substrate must be equal to the strength of a 625 μm thick monocrystalline silicon wafer.

If the thin semiconductor film 3 comprising p type polycrystalline silicon that is inferior to monocrystalline silicon is used as is for a power generating layer of a solar cell, a high-performance solar cell is not achieved. Therefore, in the step of FIG. 1(c), the thin semiconductor film 3 is subjected to zone melting recrystallization through the cap layer 4 to improve the crystalline quality of the semiconductor film 3. Thereafter, the cap layer 4 is removed.

Figure 1D:
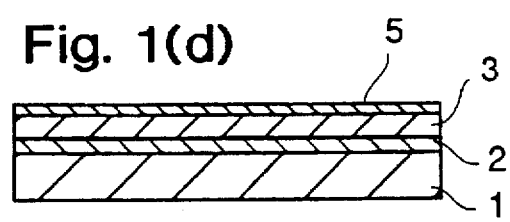

In the step of FIG. 1(d), an n type impurity dopant, such as phosphorus, is diffused into the recrystallized p type polycrystalline silicon film 3 to form an n type region having a dopant concentration of about $1 \times 10^{19}$ cm$^{-3}$, producing a pn junction.

Figure 1E:
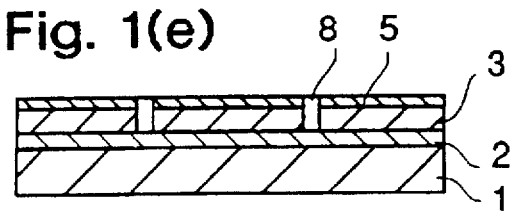

Thereafter, a plurality of through-holes 8 penetrating through the semiconductor film 3 and reaching the intermediate film 2 are formed by selectively etching desired portions of the semiconductor film 3 (FIG. 1(e)). More specifically, a mask pattern for selective etching (not shown) is formed on the semiconductor film 3 and the semiconductor film 3 is immersed in an etchant. A mixture of hydrofluoric acid and nitric acid, an aqueous solution of sodium hydroxide, or an aqueous solution of potassium hydroxide is used as the etchant. As a result of the etching, for example, a plurality of 100 μm square or 100 μm diameter through-holes are arranged in a checker pattern at a pitch of 1 mm~2 mm.

Figure 1F:
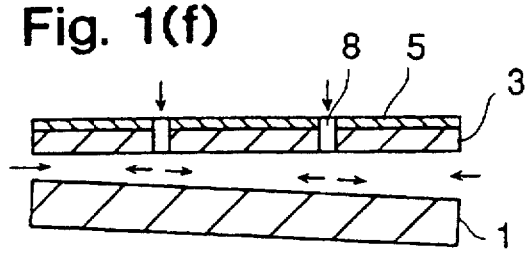

In the step of FIG. 1(f), an etchant, such as hydrofluoric acid, is applied to the intermediate silicon oxide film 2 through those holes 8 to etch away the intermediate film 2, whereby the semiconductor film 3 is separated from the heat-resistant substrate 1.

Figure 1G:
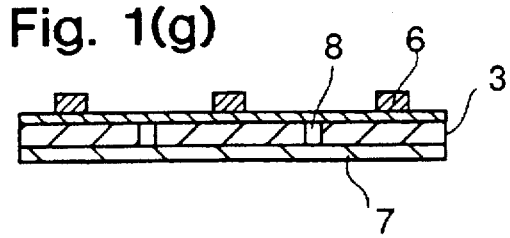

In the step of FIG. 1(g), grid electrodes 6 are fabricated on the light incident surface of the thin semiconductor film 3, i.e., in contact with the junction layer 5, and a back electrode 7 is formed on the opposite surface, completing a thin film solar cell.

In an experiment made by the inventors of the present invention, a 10 cm square and 50 μm thick semiconductor film 3 and a 1 μm thick intermediate film 2 are used, and a plurality of 100 μm square through-holes 8 are arranged at a pitch of 1 mm. In this case, the semiconductor film 3 is separated from the heat-resisting substrate 1 in about two hours with hydrofluoric acid heated to 50° C. That is, the time required for the separation is reduced to 1/500~1/1000 that of the prior art method shown in FIGS. 31(a)–31(d). In addition, the surface of the heat-resistant substrate 1 after the separation of the semiconductor film 3 is not damaged, i.e., good surface condition is maintained.

As described above., according to the first embodiment of the present invention, the intermediate film 2 comprising a material different from the semiconductor film 3 is formed on the heat-resisting substrate and, after formation of the semiconductor film 3, a plurality of through-holes 8 reaching the intermediate layer 2 are formed through the semiconductor film 3, and the intermediate layer 2 is etched through the through-holes 8 to separate the semiconductor film 3 from the heat-resisting substrate 1. Therefore, the semiconductor film 3 is separated from the substrate 1 with high efficiency, whereby the time required for fabrication of a solar cell is reduced. Further, since the surface of the substrate 1 is not damaged by the separation of the semiconductor film 3, the substrate 1 can be reused, reducing the production cost of thin film solar cells. Furthermore, in the solar cell completed by the above-described method, the through-holes 8 occupy only 1% of the light incident region, i.e., the upper surface of the semiconductor film 3, and do not adversely affect the performance of the solar cell, whereby the incident light is effectively utilized.

While in the above-described first embodiment the grid electrodes 6 are formed on the semiconductor film 3 where the through-holes 8 are absent, these electrodes may be formed over the through-holes 8. In this case, the reduction in the light incident region due to the through-holes 8 is negligible.

FIGS. 2(a)–2(g) are sectional views illustrating process steps in a method for fabricating a solar cell in accordance with a second embodiment of the present invention. In these figures, the same reference numerals as in FIGS. 1(a)–1(g) designate the same or corresponding parts. The production method of this second embodiment is fundamentally identical to the method according to the first embodiment except that the through-holes 8 are formed in the heat-resistant substrate 1.

A description is now given of the production process.

Figure 2A:
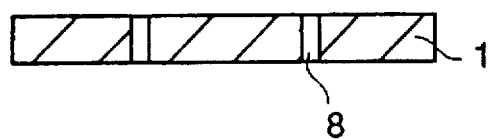
FIGS. 2(a)–2(g) are sectional views illustrating process steps in a method for fabricating a thin film solar cell in accordance with a second embodiment of the present invention.
Figure 8:
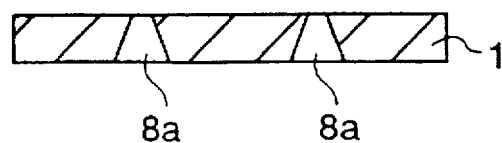
FIG. 8 is a sectional view illustrating a thin semiconductor film with through-holes produced in the methods according to the second and fourth embodiments of the invention.

Initially, as illustrated in FIG. 2(a), a plurality of holes 8 penetrating through the heat-resistant substrate 1 are produced according to a prescribed pattern. Although the diameter of the through-holes 8 shown in FIG. 2(a) is uniform from the upper surface to the lower surface of the substrate 1, it may be conic or pyramidal as shown in FIG. 8. In FIG. 8, the diameter of the through-holes 8a is smaller at the upper surface of the substrate 1 than at the lower surface. This pyramidal through-hole 8a is produced when a monocrystalline silicon substrate is anisotropically etched with an aqueous solution of sodium hydroxide or potassium hydroxide.

Figure 2B:
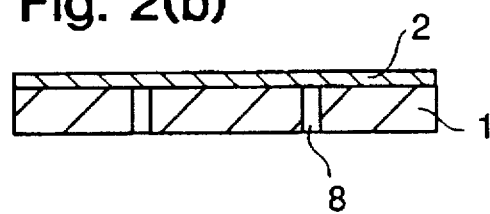

In the step of FIG. 2(b), an intermediate layer 2, such as a silicon oxide film, is formed on the heat-resisting substrate including the through-holes 8.

Figure 2C:
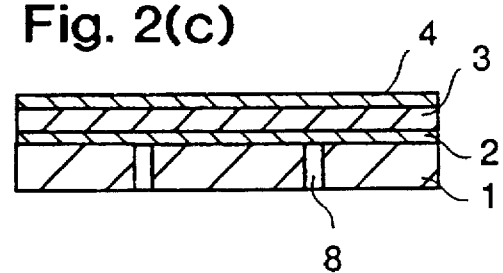

Thereafter, a thin semiconductor film 3, such as a p type polycrystalline silicon film, is formed on the intermediate layer 2 by CVD or the like, and a cap layer 4 is formed on the semiconductor film 3 (FIG. 2(c)).

Figure 2D:
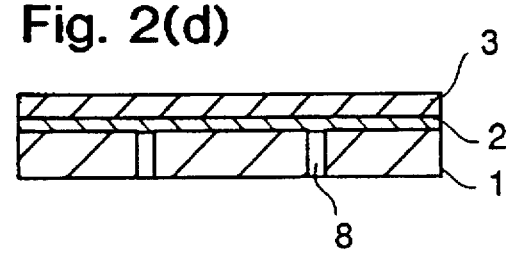

The semiconductor film 3 is subjected to zone-melting recrystallization, followed by removal of the cap-layer 4 (FIG. 2(d)).

Figure 2E:
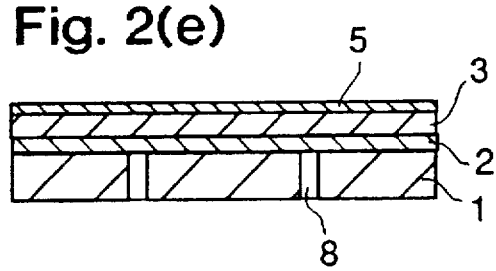
Figure 2F:
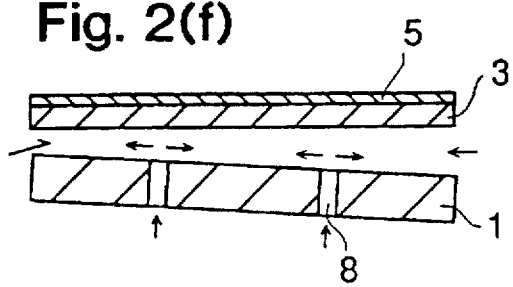

An n type impurity dopant, such as phosphorus, is then diffused into the semiconductor film 3 to produce a junction region 5 (FIG. 2(e)). Then, hydrofluoric acid is applied to the intermediate layer 2 through the holes 8 to etch away the intermediate layer 2, whereby the semiconductor film 3 is separated from the heat-resistant substrate 1 (FIG. 2(f)).

Figure 2G:
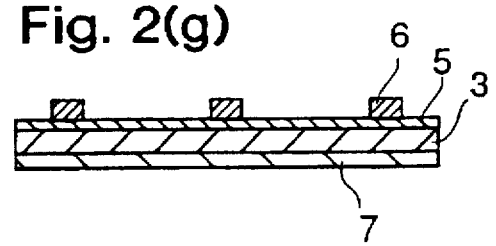

To complete a thin film solar cell grid electrodes 6 and a backs electrode 7 are produced on the front and rear surfaces of the semiconductor film 3, respectively (FIG. 2(g)).

Also in this second embodiment of the present invention, the thin semiconductor film 3 is separated from the heat-resistant substrate 1 with high efficiency, without damaging the surface of the substrate 1, whereby the production cost of the solar cell is reduced.

Furthermore, since the reusable substrate 1 includes the through-holes 8, the process step of forming the through-holes 8 in the thin semiconductor film 3 shown in FIG. 1(e) is dispensed with, whereby the production process is simplified, resulting in further reduction in the production cost.

Furthermore, since the thin semiconductor film 3 includes no through-holes, the power generating region of the solar cell is increased compared to the solar cell according to the first embodiment, whereby the performance of the solar cell is further improved.

FIGS. 3(a)–3(g) are sectional views illustrating process steps in a method for producing a thin film solar cell in accordance with a third embodiment of the present invention. In these figures, the same reference numerals as those in FIGS. 1(a)–1(g) and 2(a)–2(g) designate the same or corresponding parts. Reference numeral 10 designates through-holes. While in the above-described second embodiment of the invention, the through-holes 8 formed through the heat-resistant substrate 1 are covered with the intermediate layer 2 (FIG. 2(b)), in this third embodiment the through-holes 8 are not covered with the intermediate layer 2.

The production process will be described hereinafter.

Figure 3A:
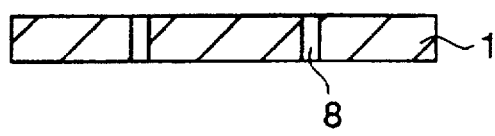
FIGS. 3(a)–3(g) are sectional view illustrating process steps in a method for fabricating a thin film solar cell in accordance with a third embodiment of the present invention.

Initially, as illustrated in FIG. 3(a), plurality of holes 8 penetrating through the heat-resistant substrate 1 are produced according to a prescribed pattern.

Figure 3B:
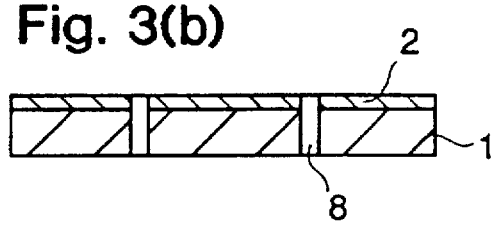

Thereafter, an intermediate layer 2, such as a silicon oxide film, is formed on the surface of the substrate 1 where the through-holes 8 are absent (FIG. 3(b)).

Figure 3C:
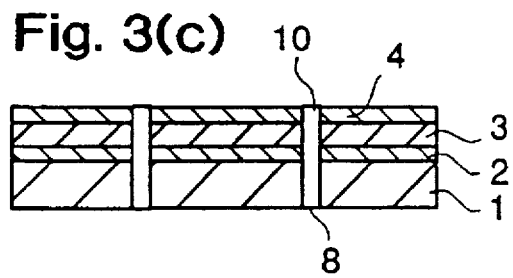

In the step of FIG. 3(c), a thin semiconductor film 3 is formed on the intermediate layer 2 by CVD or the like and, thereafter, a cap layer 4 is formed on he semiconductor film 3. The semiconductor film 3 and the cap layer 4 are not deposited on the through-holes 8 because the through-holes 8 do not support them, so that holes 10 are spontaneously formed through portions of the semiconductor film 3 and the cap layer 4 opposite the through-holes 8. Since the semiconductor film 3 grows in the transverse direction, i.e., from the periphery toward the center of the through-holes 8 the diameter of the through-hole 10 formed in the semiconductor film 3 is smaller than the diameter of the through-holes 8 formed in the substrate 1.

Figure 3D:
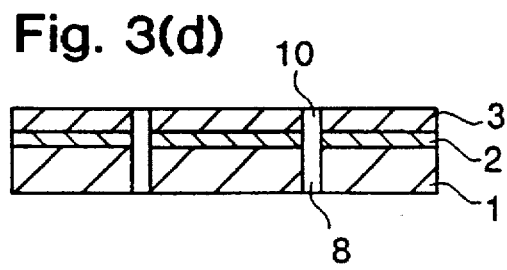

In the step of FIG. 3(d), the semiconductor film 3 is subjected to zone-melting recrystallization, followed by removal of the cap layer 4.

Figure 3E:
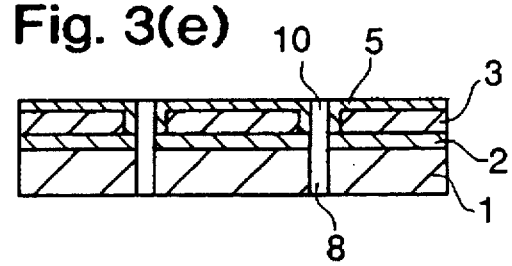
Figure 3F:
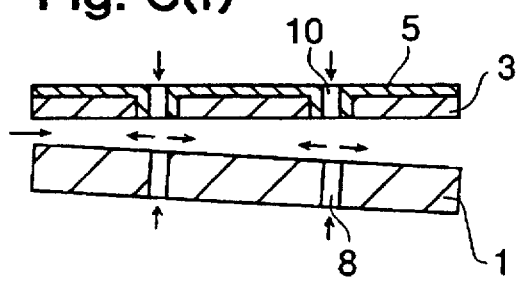
Figure 3G:
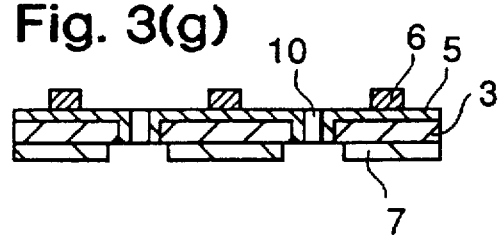

Thereafter, an n type impurity dopant, such as phosphorus, is diffused from the surface of the semiconductor film 3 to form a junction region 5 (FIG. 3(e)). Then, hydrofluoric acid is applied to the intermediate layer 2 through the holes 8 and 10 to etch away the intermediate layer 2, whereby the semiconductor film 3 is separated from the heat-resistant substrate 1 (FIG. 3(f)).

To complete a thin film solar cell, a grid electrode 6 and a back electrode 7 are produced on the front and rear surfaces of the semiconductor film 3, respectively. (FIG. 3(g)).

In the above-described production method according to the third embodiment of the invention, the intermediate layer 2 is etched away with the etchant applied to that layer through the holes 8 formed in the heat-resistant substrate 1 and the holes 10 formed in the semiconductor film 3 to separate the semiconductor film 3 from the substrate 1. Therefore, the time required for the separation is reduced compared to the first and second embodiments of the invention, resulting in further reduction in the production cost.

FIGS. 4(a)–4(h) are sectional views illustrating process steps in a method for fabricating a thin film solar cell in accordance with a fourth embodiment of the present invention. In these figures, the same reference numerals as in FIGS. 1(a)–1(g) designate the same or corresponding parts. Reference numeral 3a designates a first p type polycrystalline silicon film, numeral 3b designates a second p type polycrystalline silicon film, 4a designates a silicon oxide film, and numeral 4b designates a silicon nitride film.

FIG. 5(a) is a perspective view for explaining a zone-melting recrystallization process in the production method according to this fourth embodiment, FIG. 5(b) illustrates the six inch diameter silicon wafer, FIG. 5(c) shows the structure of layers disposed on the silicon wafer, and FIG. 6 illustrates a model of crystal defects in a semiconductor film after the zone-melting recrystallization process.

The production process of FIG. 4 will be described hereinafter.

Figure 4A:
FIGS. 4(a)–4(h) are sectional views illustrating process steps in a method for fabricating a thin film solar cell in accordance with a fourth embodiment of the present invention.

Initially, a six-inch diameter monocrystalline silicon wafer is prepared as the heath resisting substrate. 1. As illustrated in FIG. 4(a), a first silicon oxide film 2 is deposited on the substrate 1 to a thickness of about 2 μm. Preferably, the silicon oxide film 2 is deposited by low-pressure chemical vapor deposition (LP-CVD) using tetra ethoxy silane (TEOS) as a source material.

Figure 4B:
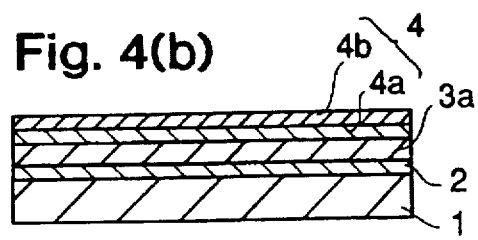

In the step of FIG. 4(b), a first p type polycrystalline silicon film 3a is grown on the silicon oxide film 2 by LP-CVD. In the LP-CVD process, silane ($SiH_4$) gas is used as a source material, and diborane ($B_2H_6$) gas is supplied at the same time as the silane gas. The growth temperature is 620° C. The growth is continued until the polycrystalline silicon film 3a has a thickness of 1 μm and a boron (B) ion concentration of $1\times10^{19}$ $cm^{-3}$. Subsequently, a second silicon oxide film 4a about 2 μm thick is grown on the first p type polycrystalline silicon film 3a using TEOS as a source material. Further, a silicon nitride film 4b about 300 Å thick is grown by LP-CVD using dichlorosilane ($SiH_2Cl_2$) gas and ammonia gas as source materials. The silicon oxide film 4a and silicon nitride film 4b serve as a cap layer 4.

Thereafter, the first p type polycrystalline silicon film 3a is subjected to zone-melting recrystallization as shown in FIG. 5(a). In FIG. 5(a), a carbon heater 61 is disposed under the wafer shown in FIG. 4(b). A carbon strip heater 62 having a width of 1 mm and a height of 3 mm is positioned about 1 mm above the cap layer 4. In a vacuum chamber (not shown), the wafer is heated from the rear surface to about 1300° C. by the carbon heater 61, and the carbon strip heater 62 is moved across the wafer in a prescribed direction at 0.2 mm/s, whereby the p type polycrystalline silicon film 3a is melted and recrystallized. The p type polycrystalline silicon film 3a after the zone-melting recrystallization process comprises a plurality of crystal grains extending in the strip heater moving direction. The length of each crystal grain is several centimeters. Some of the crystal grains extend from one end of the wafer to the other end. The width of the crystal grain is several millimeters. Most of the crystal grains have a (100) surface orientation, and deviations in the surface orientations between these crystal grains are only in the direction of rotation around an axis perpendicular to the surface of the first p type polycrystalline silicon film 3a. In addition to grain boundaries produced between adjacent crystal grains, as shown in FIG. 6, crystal defects, such as sub-boundary A, dislocation D, and dislocation group D', are produced in a single crystal grain due to the recrystallization. In FIG. 6, character R shows the grain boundary and character S shows the twin crystal. The density of these crystal defects is about $10^6/cm^2$.

A description is now given of other advantages given by the zone-melting recrystallization of the p type polycrystalline silicon film 3a.

Generally, a boron-doped polycrystalline silicon film grown by LP-CVD at a relatively low temperature has a relatively high resistivity because boron ions in that film are not adequately activated. In this fourth embodiment of the invention, however, since the first p type polycrystalline silicon film 3a is once melted in the zone-melting recrystallization process, boron ions in that film 3a are adequately activated, resulting in a low-resistivity p type polycrystalline silicon film. Generally, the segregation coefficient of boron in silicon (the ratio of the solubility of boron in liquid silicon to the solubility of boron in solid silicon) is about 0.9, much higher than the segregation coefficients of other impurity elements. In he present invention, the zone-melting recrystallization process discourages refining, i.e., sweeping of impurities, so that the uniformity of the resistivity of the first p type polycrystalline silicon film 3a is improved. In this embodiment of the invention, boron ions are present in a concentration of $1\times10^{19}$ $cm^{-3}$ to produce a p type polycrystalline silicon film having a resistivity of 0.01 Ω·cm. In this case, the variation in the resistivity of the p type polycrystalline silicon film 3a after the zone-melting recrystallization process is in a range of ±10%. Further, in the zone-melting recrystallization process, since the temperature rises to the melting point of silicon (1414° C.), the silicon oxide cap film 4a is softened and united with the overlying thin silicon nitride cap film 4b. Therefore, the cap layer 4 comprising these films 4a and 4b is easily removed with hydrofluoric acid. In addition, since components of the silicon nitride film 4b are mixed into the silicon oxide film 4a, the adhesion between the cap layer 4 and the polycrystalline silicon film 3a is improved during the zone-melting recrystallization process, as compared to the case where a silicon oxide film is used as the cap layer 4, whereby the polycrystalline silicon film 3a is recrystallized with high uniformity. When the cap layer 4 comprises a silicon oxide film as in the above-described first to third embodiments, the molten silicon is apt to agglomerate, resulting in uneven thickness of the polycrystalline silicon film 3a. In the worst case, the polycrystalline silicon film 3a is cracked.

Figure 4C:
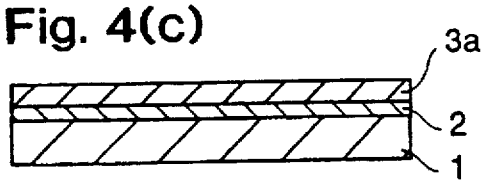
Figure 4D:
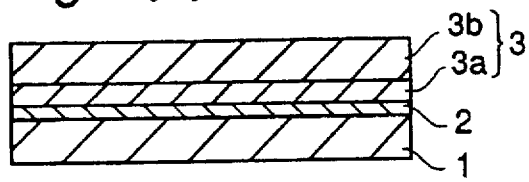

After removal of the cap layer 4 with hydrofluoric acid (FIG. 4(c)), a second p type polycrystalline silicon film 3b is epitaxially grown on the first p type polycrystalline silicon film 3a (FIG. 4(d)). In the epitaxial growth process, silane ($SiH_4$) gas is used as a source material, and diborane ($B_2H_6$) gas is supplied at the same time as silane gas. The growth temperature is 1100° C., and the growth rate is about 1 μm/s. The growth is continued for about 30 minutes until the polycrystalline silicon film 3b has a thickness of 30 μm and a boron (B) ion concentration of $1\times10^{16}$ $cm^{-3}$. The crystalline quality of the second p type polycrystalline silicon film 3b is improved because it is grown on the first p type polycrystalline silicon film 3a whose crystalline quality is improved by the zone-melting recrystallization.

The reason why the semiconductor film 3 has a double-layer structure comprising the first p type polycrystalline silicon film 3a having a boron concentration of $1\times10^{19}$ $cm^{-3}$ and the second p type polycrystalline silicon film 3b having a boron concentration of $1\times10^{16}$ $cm^{-3}$ is that the BSF (Back Surface Field) effect is achieved by the double-layer structure. The BSF effect is mentioned in "SEMICONDUCTORS AND SEMIMETALS", VOLUME II, "Solar Cells", by Harold J. Hovel. Hereinafter, the BSF effect will be briefly described.

A great improvement in output voltage of silicon solar cells is achieved by BSF cells. In such devices, the front junction part of the solar cell is formed by an ordinary method. However, on the rear side of the cell, in place of a metal ohmic contact to a relatively high-resistivity base, a heavily-doped region is disposed adjacent to the contact.

Figure 7A:
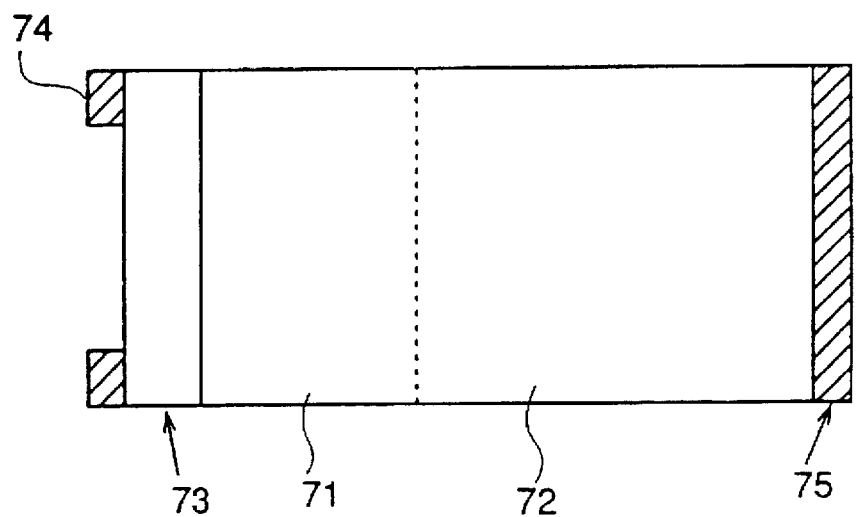
FIGS. 7(a)–7(b) are diagrams for explaining the BSF effect of a silicon solar cell.

For example, in FIG. 7(a), a first base region 71 usually has a resistivity of 1~10 Ω·cm, and a second base regions 72 is heavily doped and in contact with a rear side contact layer 75. The second base region 72 has a width of 1~2 μm if it is formed by diffusion or alloying. For some purposes, however, the width of the first base region 71 is as narrow as about 10 μm and the width of the second base region 72 is increased by forming a lightly-doped epitaxial layer on a heavily-doped substrate.

Figure 7B:
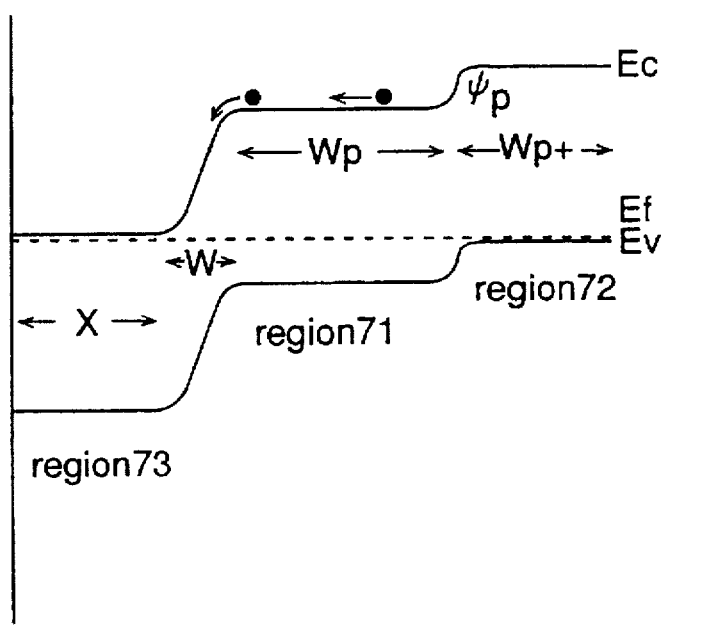

Advantages of this additional region will be described with reference to the band diagram of FIG. 7(b). The potential energy barrier $\phi_p$ between the two base regions tends confine minority carriers within the lightly-doped region which is spaced part from the ohmic contact at the rear surface which has an infinite surface recombination velocity. If the width $W_p$ is equal to or less than the diffusion length $L_n$ in the first region 71, some of electrons that will be lost at the rear surface cross the pn junction, increasing the short-circuit current. As a first approximation, assuming that $W_p \geq W_p^+$, the BSF cell is modeled like an ordinary cell having a width of $X_j+W+W_p$ that provides a significantly lowered recombination rate at the rear surface.

The open circuit voltage of an N on P BSF cell having a base resistivity of 10 Ωcm is about 10% higher than the open voltage of a conventional cell of th same type (0.6 V compared to 0.55 V). This result is attributed to the following three factors. First is the increased short-circuit current. Second is a decrease in the current Io (diode saturation current) due to reduced recombination of electrons injected from the n$^+$ region 73 to the base at the back surface. Third is modulation of the potential barrier $\phi_p$ due to variation in the minority carrier density at the edge of the high-low junction between the base regions 71 and 72, i.e., appearance of a part of the barrier $\phi_p$ at the output terminal in addition to the voltage from the p-n junction when the cell is opened.

Figure 4E:
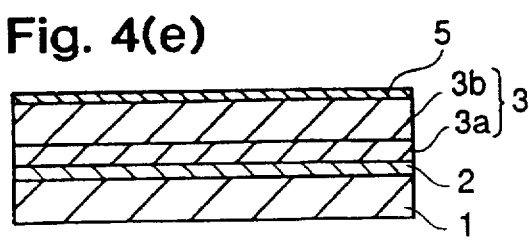

Turning to FIG. 4(e), an n type impurity, such as phosphorus, is diffused from the surface of the second p type polycrystalline silicon film 3b at 850° C. to form an n type region 5 having a sheet resistance of about 60 Ω/□, whereby a pn junction is produced. The diffusion of phosphorus is carried out using phosphorus oxytrichloride (POCl$_3$) as a diffusion source for eighteen minutes.

Thereafter, a prescribed pattern of silicon nitride film (not shown) is formed on the semiconductor film 3, and the rear surface of the substrate 1 is covered with a silicon nitride film (not shown). Using the silicon nitride pattern and film as masks, through-holes 8 are formed in the semiconductor film 3 using an aqueous solution of potassium hydroxide heated to about 80° C. (FIG. 4(f)). The silicon nitride film pattern is produced in the following process. Initially, a silicon oxide film about 1000 Å thick is formed on the surface of the semiconductor film 3 by oxidizing that surface in dry oxygen at 800° C. for five minutes and, thereafter, a silicon nitride film is formed on the silicon oxide film to a thickness of about 1000 Å. Then, a photoresist film is deposited on the silicon nitride film and patterned by screen printing. Using this photoresist pattern (not shown) as a mask, a plurality of 100 micron square holes are formed in the silicon nitride at a pitch of 1 mm using heated phosphoric acid. A stripe-shaped hole, through which a 10 cm square portion will be cut out of the semiconductor film 3, is formed simultaneously with those holes. The etching using the aqueous solution of potassium hydroxide is anisotropic and the polycrystalline silicon film 3 has a (100) surface orientation, so that reverse pyramid-shaped through-holes 8 are produced. In addition, the etching rate of the silicon oxide film by the aqueous solution of potassium hydroxide is about 1/200 of the etching rate of polycrystalline silicon by that solution, so that the etching in the depth direction substantially stops at the silicon oxide film. Further, the size of the opening of the silicon nitride film pattern is 100 microns$^2$ at the surface of the semiconductor film 3, and the thickness of the semiconductor film 3 is about 30 μm, so that the size of the opening of the through-hole 8 at the rear surface of the semiconductor film 3 is about 60 microns$^2$. Therefore, the through-holes 8 cause only 0.4% reduction in the light incident area. Further, during the etching process, a stripe-shaped hole (not shown) surrounding a 10 cm$^2$ region of the semiconductor film 3 is produced opposite the stripe-shaped hole of the silicon nitride film.

Figure 4F:
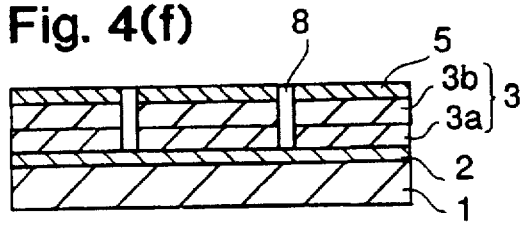
Figure 4G:
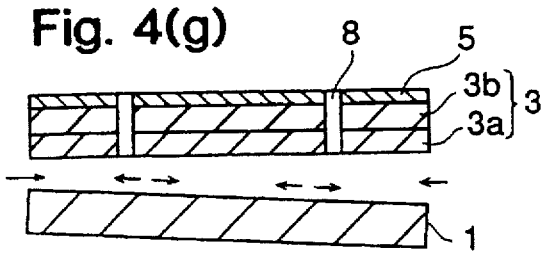

Thereafter, the wafer shown in FIG. 4(f) is immersed in hydrofluoric acid heated to about 50° C. to etch away the intermediate layer 2 through the holes 8, whereby the semiconductor film 3 is separated from the heat-resistant substrate 1 (FIG. 4(g)). The intermediate layer 2 is completely removed in about one hour. Since such a 10 cm$^2$ semiconductor film about 30 μm thick does not have adequate mechanical strength and easily breaks, it is supported by a support plate to facilitate handling.

Figure 4H:
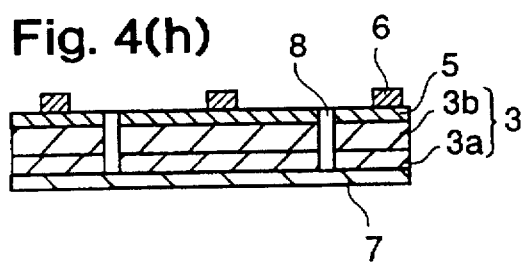

In the step of FIG. 4(h), grid electrodes 6 are formed on the front surface of the semiconductor film 3, i.e., in contact with the junction region 5, and a back electrode 7 is formed on the lower surface of the back surface of the semiconductor film 3. The grid electrodes 6 are produced in the following process. Initially, a silicon nitride film about 800 Å thick is deposited on the surface of the semiconductor film 3 by plasma CVD to produce an anti-reflection film (not shown), and a photoresist pattern is formed on the anti-reflection film. Using the photoresist pattern as a mask, the anti-reflection film is etched with hydrofluoric acid to form a plurality of openings in the anti-reflection film. Thereafter, silver paste is printed through the openings and baked. The back electrode 7 is produced by sputter-depositing aluminum on the rear-surface of the semiconductor film 3 and baking the aluminum layer.

When the completed thin film solar cell is irradiated with pseudo solar light having an intensity of 100 mW/cm$^2$ and 1.5 A.M. (this is similar to the solar spectrum at the latitude of Japan), short-circuit current density of 29.5 mA/cm$^2$, an open voltage of 0.59 V, a fill factor of 0.77, and a conversion efficiency of 13.4%, are achieved.

In the above-described production method according to the fourth embodiment, the cap layer 4 comprises the silicon oxide film 4a and the silicon nitride film 4b, and the first polycrystalline silicon film 3a is subjected to zone-melting recrystallization through the cap layer 4. Therefore, the polycrystalline silicon film 3a after the zone-melting recrystallization process has a uniform thickness, whereby thin film solar cells with uniform characteristics are produced with high-reproducibility. Further, the second p type polycrystalline silicon film 3b is epitaxially grown on the recrystallized first polycrystalline silicon film 3a, and these first and second films serve as a power generating layer of the solar cell. Therefore, the power generating layer i.e., the semiconductor film 3, is produced with improved crystalline quality and a desired thickness, whereby thin film solar cells with desired characteristics are produced with high reproducibility.

While in the above-described fourth embodiment the process steps in the production method are described with specific materials and values, those materials and values can be applied to corresponding process steps in the methods already described with respect to the first to third embodiments and methods described hereinafter.

FIGS. 9(a)–9(g) are sectional views illustrating process steps in a method for fabricating a thin film solar cell in accordance with a fifth embodiment of the present invention. In these figures, the same reference numerals as in FIGS. 1(a)–1(g) designate the same or corresponding parts. Reference numeral 20 designates a transparent adhesive, numeral 27 designates a first electrode, numeral 28 designates a second electrode, numeral 29 designates a glass plate, and numeral 50 designates a mask.

Figure 9A:
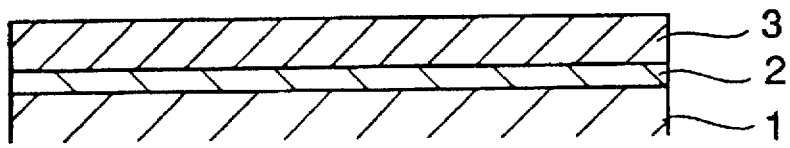
FIGS. 9(a)–9(g) are sectional views illustrating process steps in a method for fabricating a thin film solar cell in accordance with a fifth embodiment of the present invention.

Initially, as in the above-described first embodiment, an intermediate layer 2, a semiconductor thin film 3, and a cap layer 4 are successively produced on the heat-resistant substrate 1, and the semiconductor film 3 is subjected to zone-melting recrystallization, followed by removal of the cap layer 4 (FIG. 9(a)). The semiconductor film 3 is a p type polycrystalline silicon film having a thickness of 60 μm and a resistivity of about 1 Ωcm.

Figure 9B:
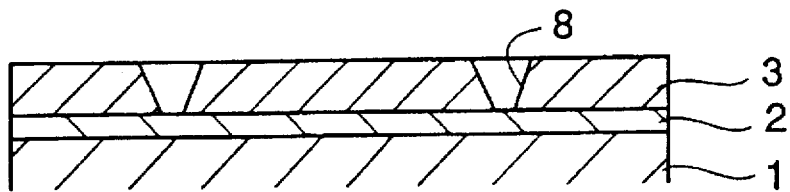

In the step of FIG. 9(b), a mask pattern (not shown) is formed on the surface of the semiconductor film 3, and the semiconductor film 3 is subjected to anisotropic alkali etching with an aqueous solution of potassium hydroxide or sodium hydroxide through the mask pattern to produce a plurality of through-holes 8 in the semiconductor film 3. These through-holes 8 are arranged in a checkered pattern at a pitch of 1 mm. Since the semiconductor film 3 has a (100) surface orientation, each through-hole 8 is shaped like a reverse pyramid, i.e., it has an aperture larger at the front surface of the semiconductor film 3 than at the rear surface. The size of the opening of the through-hole 8 at the rear surface of the semiconductor film 3 is 100 square microns.

Figure 9C:
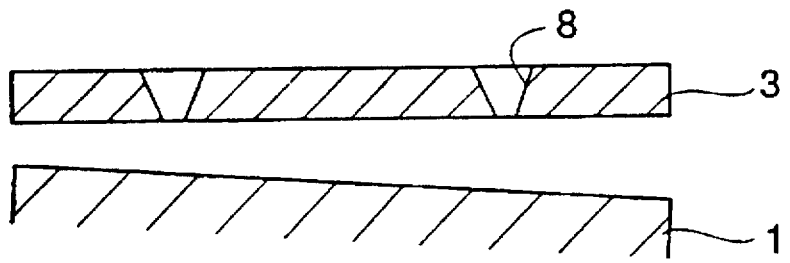

In the step of FIG. 9(c), the wafer shown in FIG. 9(b) is immersed in hydrofluoric acid heated to about 70° C. to etch away the intermediate layer 2 through the holes 8, whereby the semiconductor film 3 is separated from the substrate 1. The intermediate layer 2 is completely removed in about two hours.

Figure 9D:
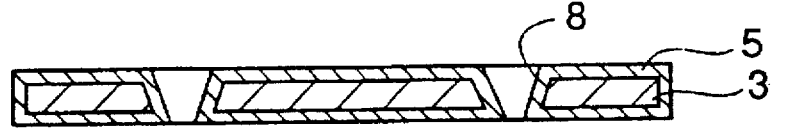

Thereafter, an n type impurity dopant, such as phosphorus, is diffused over the entire surface of the semiconductor film 3, forming a junction region 5 (FIG. 9(d)). Since the through-holes 8 are shaped like reverse pyramids as described above, the dopant also diffuses from the internal surfaces of the through-holes 8. Since the diameter of the opening of the through-holes 8 (100 μm) at the surface of the semiconductor film 3 is larger than the thickness of the semiconductor film 3 (60 μm~), phosphorus is easily applied to the internal surface of the through-hole 8, so that the junction region 5 is formed at the internal surface of the through-holes 8 with high reliability.

Thereafter, an anti-reflection film (not shown) is formed on the upper surface of the semiconductor film 3, i.e., the light incident surface of a solar cell to be fabricated. The through-holes 8 at the lower surface of the semiconductor film 3 and portions in the vicinity of the through-holes 8 are covered with masks 50, and unmasked portions of the junction region 5 at the lower surface of the semiconductor film 3 are removed by dry etching (FIG. 9(e)). In the figure, the dry etching proceeds in the direction indicated by the arrows. These unnecessary portions of the junction region 5 may be removed by other techniques.

Figure 9E:
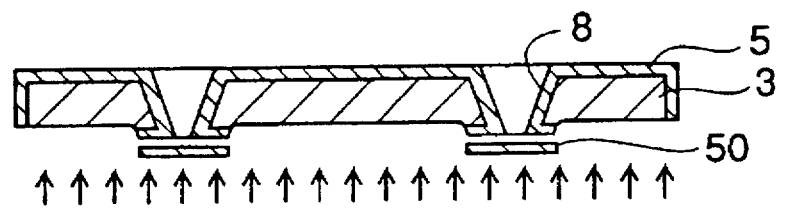
Figure 9F:
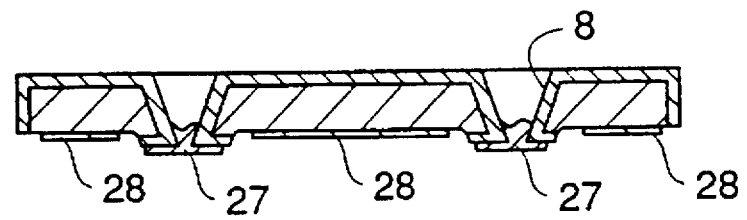
Figure 10:
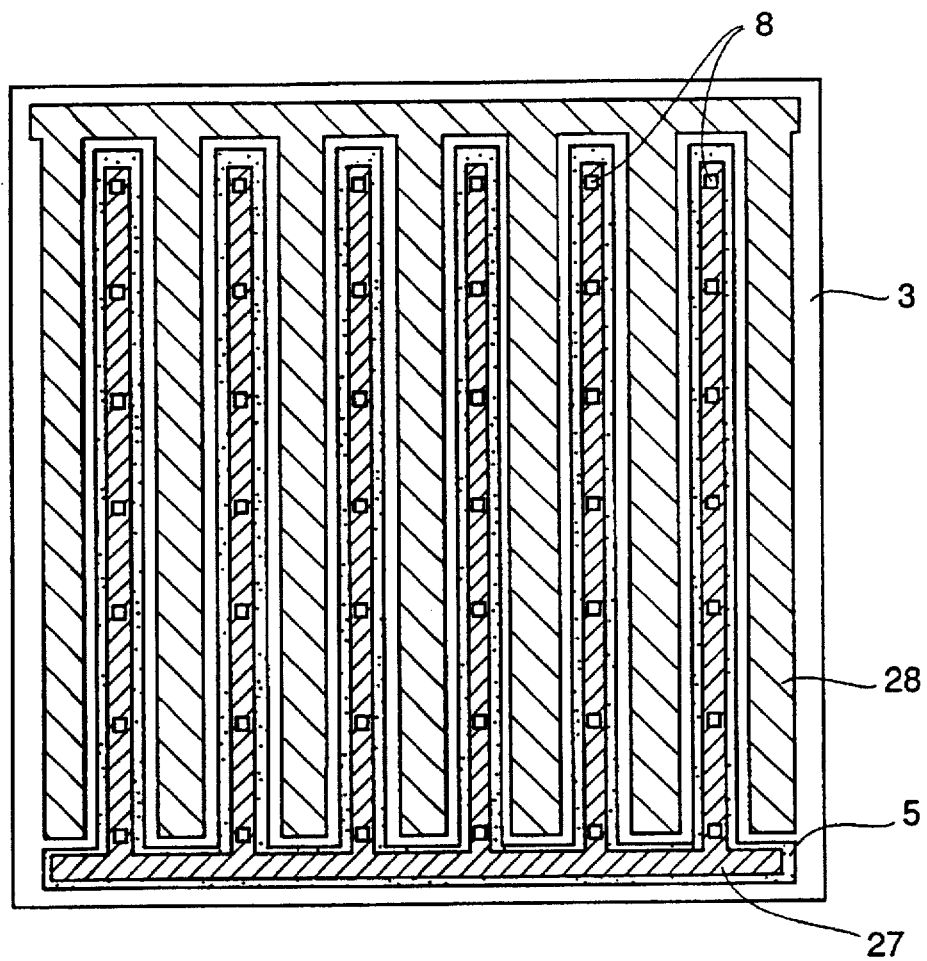
FIG. 10 is a plan view illustrating an electrode pattern of the thin film solar cell according to the fifth embodiment of the invention.

In the step of FIG. 9(f), first electrodes (n side electrodes) 27 are formed in contact with the n type junction region 5 remaining at the lower surface of the semiconductor film 3, and second electrodes (p side electrodes) 28 are formed in contact with the p type region exposed by the removal of the n type region 5. Preferably, the first electrodes 27 comprise silver, and the second electrodes 28 comprise aluminum. FIG. 10 is a plan view illustrating a preferable arrangement of these first and second electrodes 27 and 28. In the figure, the first and second electrodes 27 and 28 are alternatingly arranged parallel to each other. This arrangement reduces the electric resistance between the first and second electrodes, whereby the loss of generated electricity is reduced. Although it is not shown in FIG. 9(f), the thin semiconductor film 3 having poor mechanical strength is supported by a prescribed support plate at the upper surface during the formation of the electrodes on the lower surface.

Figure 9G:
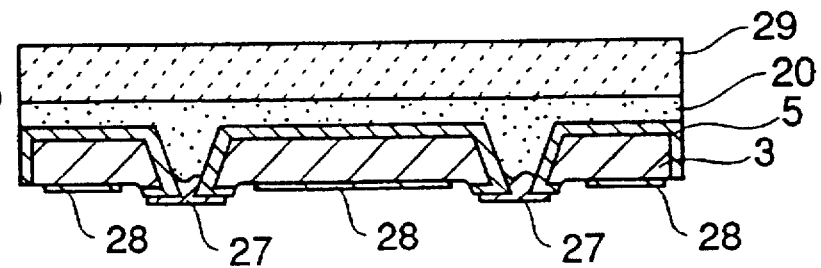

Finally, as illustrated in FIG. 9(g), the upper surface of the semiconductor film 3 where the first and second electrodes 27 and 28 are absent is adhered to a glass plate 29 using a transparent adhesive 20 to complete the solar cell. Since the thin semiconductor film 3 having poor mechanical strength is supported by the glass plate 29, workability and durability of the solar cell is improved to a practical level.

The thin film solar cell according to the fifth embodiment of the invention has no electrode on the upper surface of the semiconductor film 3, i.e., the light incident surface of the solar cell. Therefore, the light incident area is not reduced by electrodes, so that the light energy is utilized with high efficiency.

Figure 11:
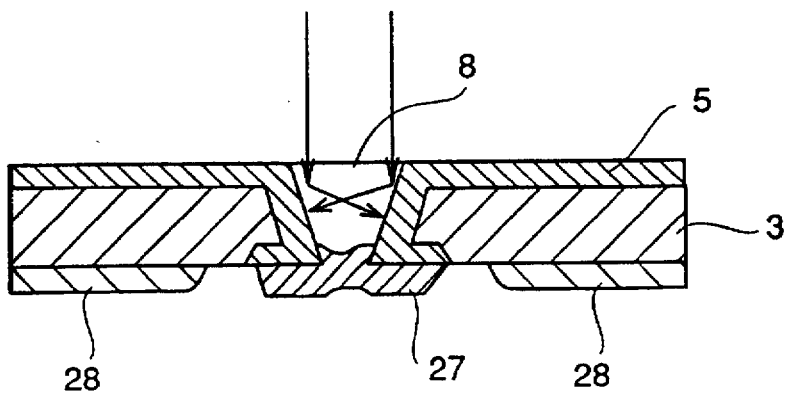
FIG. 11 is a sectional view for explaining the structure of the thin film solar cell according to the fifth embodiment of the invention.

Since no semiconductor film 3 is present in the through-holes 8, light incident on the through-holes 8 results in a loss. However, since the opening of the through-hole 8 is larger at the light incident surface of the semiconductor film 3 than at the rear surface, as shown in FIG. 11, incident light on the internal surface of the through-hole 8 is reflected and absorbed by the semiconductor film 3 at the opposite surface. Therefore, the substantial loss in the light incident area due to the through-holes 8 correlates with the area of the openings of the through-holes at the lower surface of the semiconductor film 3. When the area of the opening of each through-hole 8 at the lower surface of the semiconductor film 3 is 100 μm×100 μm and the array pitch of the through-holes 8 is 1 mm, the loss in the light incident area of the solar cell is only 1%, resulting in a significant reduction in the loss compared to the solar cell having electrodes on the light incident surface.

Further, in the above-described production method according to the fifth embodiment of the invention, the through-holes 8 produced to separate the semiconductor film 3 from the substrate 1 are used for contact holes electrically connecting the junction region 5 formed within the semiconductor film 3 to the first electrodes 27. Therefore, it is not necessary to produce additional through-holes for connecting the junction region 5 to the first electrodes 27, whereby the production process is simplified.

Figure 12:
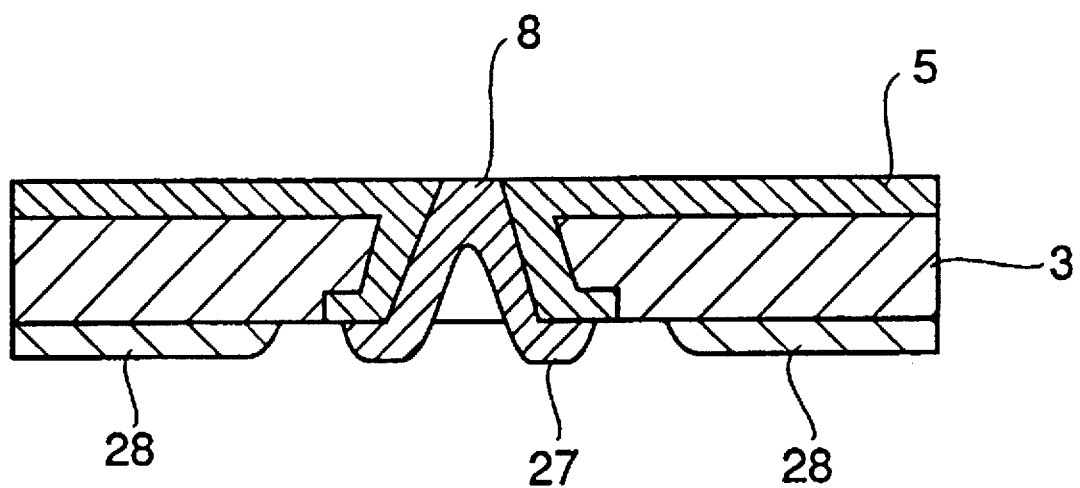
FIG. 12 is a sectional view illustrating a thin film solar cell in accordance with a sixth embodiment of the invention.

FIG. 12 is a sectional view illustrating a thin film solar cell in accordance with a sixth embodiment of the present invention. In the figure, the same reference numerals as in FIG. 11 designate the same or corresponding parts. In this sixth embodiment, the through-hole 8 is shaped like a pyramid, i.e., the opening of the through-hole 8 is smaller at the front surface of the semiconductor film 3, i.e., the light incident surface of the solar cell, than at the rear surface of that film 3. The inner wall of the through-hole 8 is completely covered with the first electrode (n side electrode) 27.

In this structure, since the inner wall of the through-hole 8 is covered with the first electrode 27, current flowing in the junction region 5 at the front surface of the semiconductor film 3 is collected by the first electrode 27 at the front surface. Therefore, even when the junction region 5 formed at the inner wall of the through-hole 8 is thin and the electric resistance at that region increases, the series resistance of the whole device can be substantially ignored. As a result, generated electricity is outputted with high efficiency.

FIGS. 13(a)–13(f) are sectional views illustrating process steps in a method for fabricating a thin film solar cell in accordance with a seventh embodiment of the present invention. In these figures, the same reference numerals as in FIGS. 9(a)–9(g) designate the same or corresponding parts.

Figure 13A:
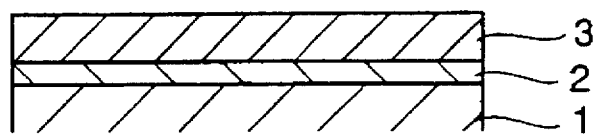
FIGS. 13(a)–13(f) are sectional views illustrating process steps in a method for fabricating a thin film solar cell in accordance with a seventh embodiment of the present invention.

Initially, as in the above-described first embodiment, a silicon oxide film 2, a semiconductor film 3, and a cap layer 4 are successively formed on the heat-resistant substrate 1, and the semiconductor film 3 is subjected to zone-melting recrystallization, followed by removal of the cap layer 4 (FIG. 13(a)).

Figure 13B:
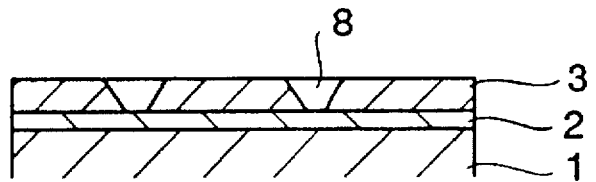

In the step of FIG. 13(b), through-holes 8 are formed in the semiconductor film 3 in the same process as already described with respect to FIG. 9(b).

Thereafter, the wafer shown in FIG. 13(b) is immersed in hydrofluoric acid to etch away portions of the intermediate silicon oxide film 2 in the vicinity of the through-holes 8. An n type impurity dopant, such as phosphorus, is diffused from the upper surface of the semiconductor film 3 to form an n type junction region 5 at the upper surface of the semiconductor film 3, the internal surface of the through-holes 8, and part of the lower surface of the semiconductor film 3 in the vicinity of the through-holes 8 (FIG. 13(c)).

Figure 13C:
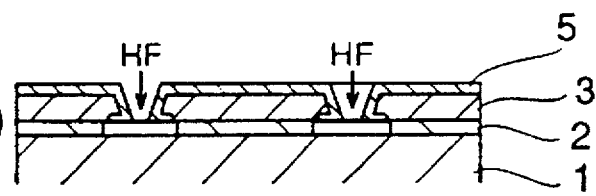
Figure 13D:
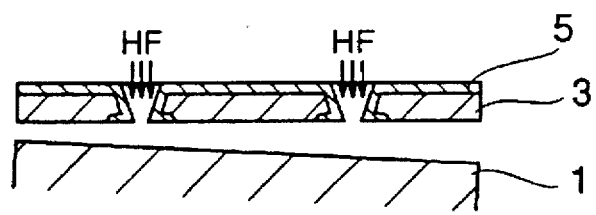

In the step of FIG. 13(d), the wafer shown in FIG. 13(c) is again immersed in hydrofluoric acid to completely etch away the intermediate silicon oxide film 2 through the holes 8, whereby the semiconductor film 3 is separated from the substrate 1.

Figure 13E:

In the step of FIG. 13(e), the upper surface of the semiconductor film 3 is adhered to a glass plate 29 using a transparent adhesive 20.

Figure 13F:
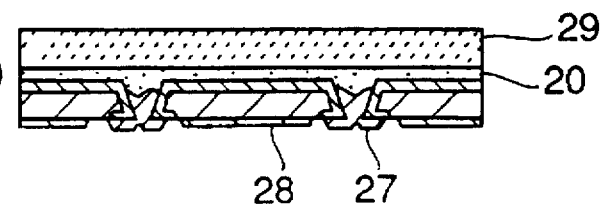

Finally, as illustrated in FIG. 13(f), first electrodes (n side electrodes) 27 are formed in contact with the n type region 5 at the lower surface of the semiconductor film 3, and second electrodes (p side electrodes) 28 are formed in contact with the p type semiconductor film 3 where the n type region 5 is absent, using different masks, to complete a thin film solar cell.

In this production method according to the seventh embodiment of the invention, since the junction region 5 is formed in the vicinity of the through-holes 8 at the lower surface of the semiconductor film 3, the patterning of the junction region 5 as shown in FIG. 9(e) is dispensed with, whereby the production process is simplified.

In the production method according to the fifth embodiment of the invention (FIGS. 9(a)–9(g)), after the separation of the semiconductor film 3 from the substrate 1, the impurity dopant is diffused from the entire surface of the semiconductor film 3 to form the junction region 5. However, since the mechanical strength of the semiconductor film 3 is poor, it is difficult to maintain the semiconductor film 3 without damage in the diffusion furnace, resulting in reduction in the productivity. On the other hand, in the production method according to this seventh embodiment, since the junction region 5 is produced before the separation of the semiconductor film 3 from the substrate 1, the above-described problem is avoided.

FIGS. 14(a)–14(e) are sectional views illustrating process steps in a method for fabricating a thin film solar cell in accordance with an eighth embodiment of the present invention. In these figures, the same reference numerals as in FIGS. 9(a)–9(g) designate the same or corresponding parts. Reference numeral 3c designates an intrinsic type (hereinafter referred to as i type) polycrystalline silicon film, and numerals 3d and 3e are $p^+$ type polycrystalline silicon films.

Figure 14A:
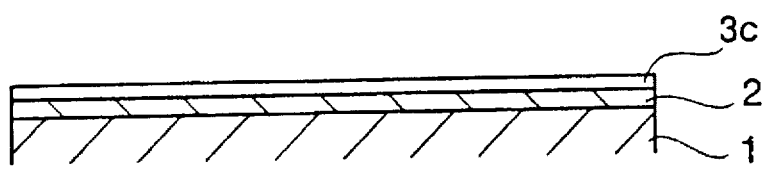
FIGS. 14(a)–14(e) are sectional views illustrating process steps in a method for fabricating a thin film solar cell in accordance with an eighth embodiment of the present invention.
Figure 14B:
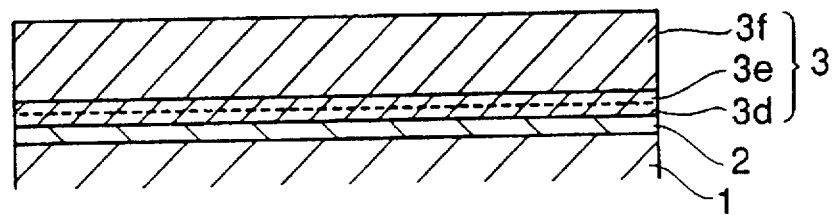

Initially, a silicon oxide film 2, an i type polycrystalline silicon film 3c, and a cap layer (not shown) are successively deposited on the heat-resistant substrate 1 by CVD and, thereafter, the i type polycrystalline silicon film 3c is subjected to zone-melting recrystallization, followed by removal of the cap layer (FIG. 14(a)).

Thereafter, a $p^+$ type polycrystalline silicon film 3e and a p type polycrystalline silicon film 3f are successively grown on the i type polycrystalline film 3c by CVD while adding boron as a dopant. During the growth process, boron contained in the $p^+$ type polycrystalline silicon film 3e is diffused into the underlying i type polycrystalline silicon film 3c, whereby the i type polycrystalline silicon film 3c is converted into a $p^+$ type polycrystalline silicon film 3d. When the i type polycrystalline silicon film 3c is 0.5 82 m thick and the $p^+$ type polycrystalline silicon film 3e is 20 μm thick and has a carrier concentration of $8 \times 10^{18}$ atoms/cm$^3$, the $p^+$ type polycrystalline silicon film 3d has a carrier concentration of $5 \times 10^{18}$ atoms/cm$^3$. These $p^+$ type polycrystalline silicon films 3d and 3e and the p type polycrystalline silicon film 3f correspond to the semiconductor film 3 of the above-described embodiments.

Figure 14C:
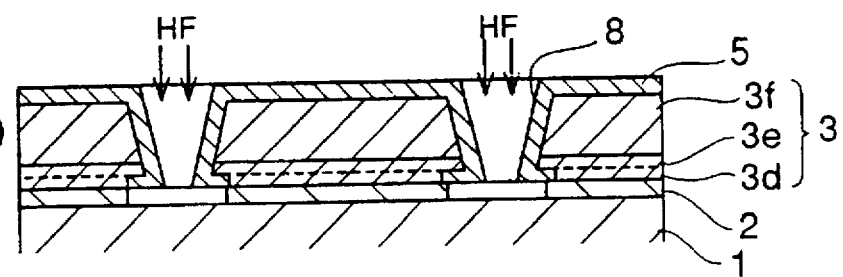

In the step of FIG. 14(c) a plurality of hole 8 penetrate through the $p^+$ type polycrystalline silicon films 3d and 3e and the p type polycrystalline silicon film 3f, and portions of the intermediate silicon oxide film 2 in the vicinity of the through-holes 8 are etched away with hydrofluoric acid applied through those through-holes 8. Thereafter, an n type impurity dopant, such as phosphorus, is diffused from the upper surface of the p type polycrystalline silicon film 3f to form an n type junction region 5 at the upper surface of the p type polycrystalline silicon-film 3f, the internal surface of the through-holes 8, and part of the $p^+$ type polycrystalline silicon film 3d in the vicinity of the through-holes 8.

Figure 14D:
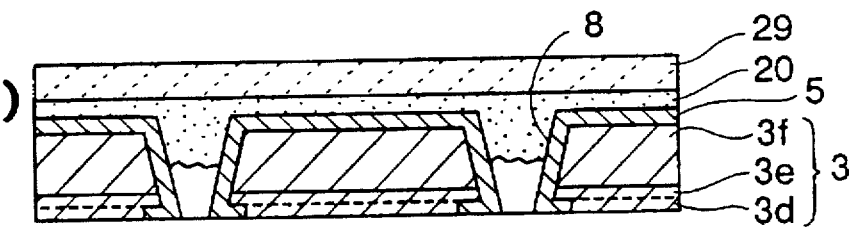

In the step of FIG. 14(d), the wafer shown in FIG. 14(c) is immersed in hydrofluoric acid to completely etch away the intermediate silicon oxide film 2, whereby the semiconductor film 3 is separated from the substrate 1. Thereafter, an anti-reflection film (not shown) is formed on the upper surface of the p type polycrystalline silicon film 3f, i.e., the light incident surface of the solar cell, and the upper surface of the p type polycrystalline silicon film 3f covered with the anti-reflection film is adhered to a glass plate 29 using a transparent adhesive 20.

Figure 14E:
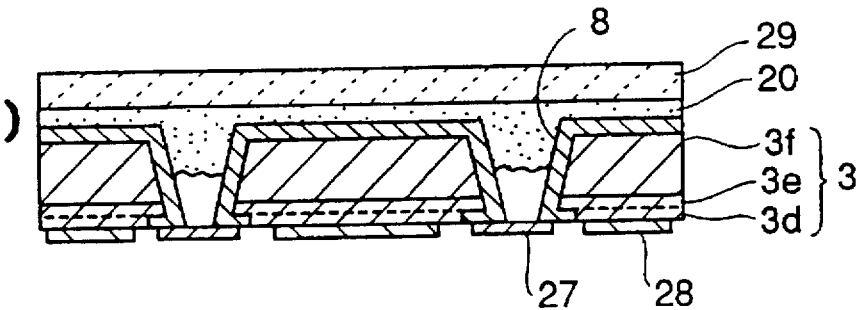

Finally, as illustrated in FIG. 14(e), first electrodes (n side electrodes) 27 are formed in contact with the n type region 5 at the surface of the $p^+$ type polycrystalline silicon film 3d, and second electrodes (p side electrodes) 28 are formed in contact with the surface of the $p^+$ type polycrystalline silicon film 3d where the n type region 5 is absent, using different masks, to complete a thin film solar cell.

In the above-described production method according to the eighth embodiment of the invention, as in the above-described seventh embodiment, since the patterning of the junction region 5 is dispensed with, the production process is simplified. In addition, since the second electrodes 28 are in contact with the highly-doped p⁺ type polycrystalline silicon film 3d, an improved ohmic contact is achieved between them, whereby higher output power is obtained.

In the above-described production method, after the zone-melting recrystallization of the i type polycrystalline silicon film 3c formed on the intermediate silicon oxide film 2, the p⁺ type polycrystalline silicon film 3e is epitaxially grown. However, the p⁺ type polycrystalline silicon film 3e may be formed directly on the intermediate film 2 without interposing the i type film 3c and, thereafter, the p⁺ type polycrystalline silicon film 3e is subjected to zone-melting recrystallization, followed by formation of the p type polycrystalline silicon film 3f.

In the above-described seventh and eighth embodiments, the intermediate silicon oxide film 2 is partially etched away through the through-holes 8 and thereafter, the junction region 5 is formed in the vicinity of the through-holes 8 at the lower surface of the semiconductor film 3 by diffusion of an impurity dopant, such as phosphorus. In this case, since the etchant and the dopant gas are applied to the intermediate film 2 only through the through-holes 8, if the bottom openings of these through-holes. 8 are reduced in size, the etching time of the intermediate film 2 becomes longer. In addition, since the dopant gas is not adequately applied to the lower surface of the semiconductor film 3, the thickness of the junction region 5 formed at the lower surface is reduced, increasing the electric resistance at that region.

These problems are solved in the ninth and tenth embodiments of the present invention described hereinafter.

FIGS. 15(a)–15(f) are sectional views illustrating process steps in a method for fabricating a thin film solar cell in accordance with a ninth embodiment of the present invention. In these figures, the same reference numerals as in FIGS. 9(a)–9(g) designate the same or corresponding parts. Reference numeral 5a designates a semiconductor film, such as an n⁺ type polycrystalline silicon film.

Initially, a silicon oxide film 2, an n⁺ type polycrystalline silicon film 5a having a dopant concentration of 1×10¹⁹ cm⁻³ (hereinafter referred to as semiconductor junction forming film), and a cap-layer (not shown) are successively formed on the heat-resistant substrate 1 by CVD or the like, and the semiconductor junction film 5a is subjected to zone-melting recrystallization, followed by removal of the cap layer (FIG. 15(a)).

Figure 15A:
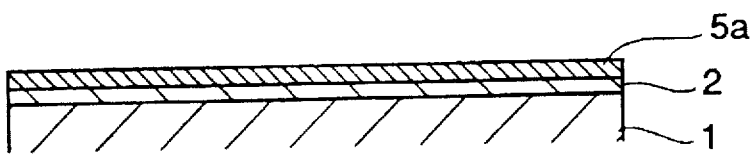
FIGS. 15(a)–15(f) are sectional views illustrating process steps in a method for fabricating a thin film solar cell in accordance with a ninth embodiment of the present invention.
Figure 15B:
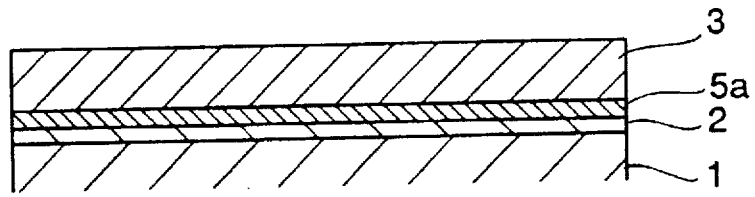

Thereafter, a semiconductor film 3, such as a p type polycrystalline silicon film, as a power generating layer of a solar-cell is epitaxially grown on the semiconductor junction forming film 5a by CVD or the like (FIG. 15(b)).

Figure 15C:
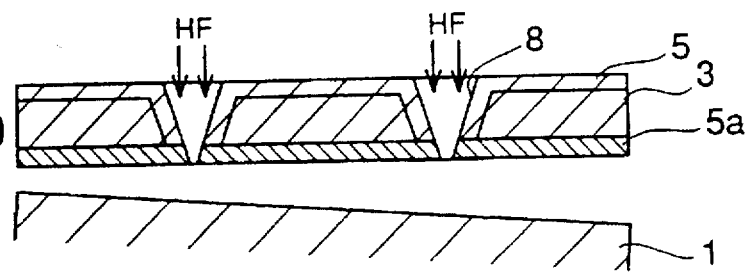

In the step of FIG. 15(c), a plurality of holes 8 are produced penetrating through the semiconductor film 3 and the semiconductor junction forming film 5a, and an n type impurity dopant is diffused from the upper surface of the semiconductor film 3 to produce a junction region 5 at the upper surface of the semiconductor film 3 and the internal surface of the through-holes 8. Thereafter, the wafer is immersed in hydrofluoric acid to completely etch away the intermediate silicon oxide film 2 through the through-holes 8, whereby the semiconductor film 3 and the semiconductor film 5a are separated from the substrate 1.

Figure 15D:
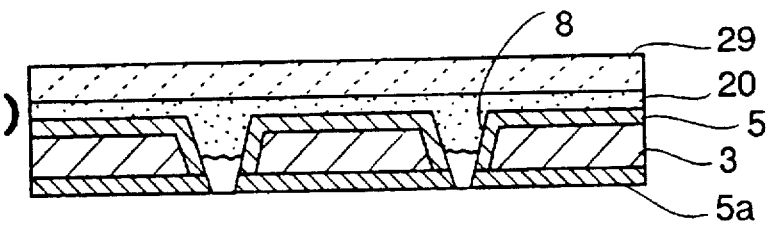
Figure 15E:
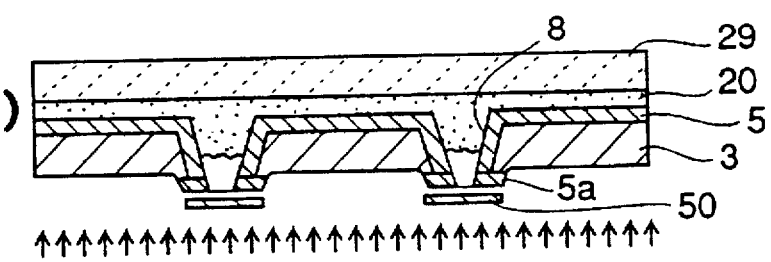

In the step of FIG. 15(d), an anti-reflection film (not shown) is formed on the upper surface of the semiconductor film 3, i.e., the light incident surface of the solar cell, and the upper surface of the semiconductor film 3 covered with the anti-reflection film is adhered to a glass plate 29 via transparent adhesive 20.

Thereafter, the openings of the through-holes 8 at the lower surface of the junction forming film 5a and portions in the vicinity of the through holes 8 are covered with masks 50, and the semiconductor film 3 and the semiconductor junction forming film 5a are dry-etched in the direction indicated by the arrows in FIG. 15(a) to selectively remove portions of these films 3 and 5a.

Figure 15F:
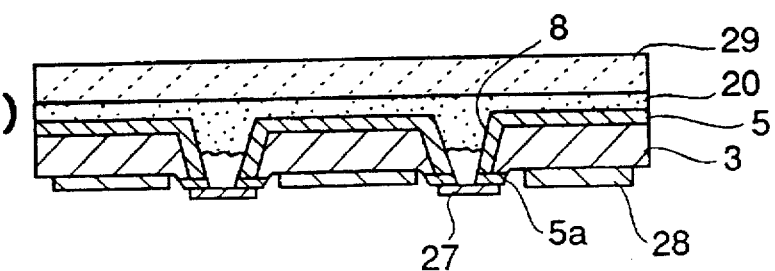

Finally, as illustrated in FIG. 15(f), first electrodes (n side electrodes) 27 are produced in contact with the remaining portions of the junction forming film 5a, and second electrodes (p side electrodes) 28 are produced on the surface of the semiconductor film 3 exposed by the etching, using different masks, whereby a thin film solar cell is completed.

In the above-described production process, since the semiconductor junction forming film 5a is previously produced on the lower surface of the semiconductor film 3, the process steps of partially etching away the intermediate film 2 through the through-holes 8 and applying a dopant gas to the lower surface of the semiconductor film 3 to form the junction region 5 in the vicinity of the through-holes 8 as in the seventh and eighth embodiments of the invention are dispensed with, reducing the production time. Further, since the junction forming film 5a formed on the lower surface of the semiconductor film 3 is adequately thick, the electric resistance of the junction forming film 5a in the vicinity of the through-holes 8 is low, resulting in high output power from the solar cell.

Furthermore, in this ninth embodiment of the invention, the semiconductor junction forming film 5a has a high impurity dopant concentration of about 1×10¹⁹ cm⁻³, and the ohmic contact between the first electrodes 27 and the junction forming film 5a is improved compared to the above-described embodiments, resulting in higher output power of the solar cell.

FIGS. 16(a)–16(e) are sectional views illustrating process steps in a method for fabricating a thin film solar cell in accordance with a tenth embodiment of the present invention. In these figures, the same reference numerals as in FIGS. 9(a)–9(g) designate the same or corresponding parts. Reference numerals 5b and 5c designate n⁺ type polycrystalline silicon films, and numerals 3h and 3g designate p type polycrystalline-silicon films.

Figure 16A:
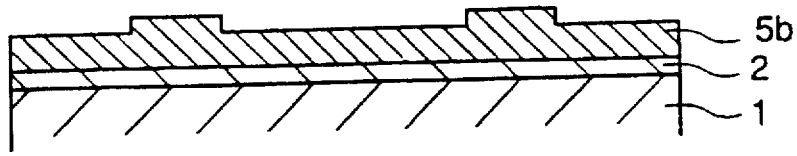
FIGS. 16(a)–16(e) are sectional views illustrating process steps in a method for fabricating a thin film solar cell in accordance with a tenth embodiment of the present invention.

Initially, a silicon oxide film 2, an n⁺ type polycrystalline silicon film 5b including a plurality of projections at its top surface and having a dopant concentration of about 1×10¹⁹ cm⁻³, and a cap layer (not shown) are successively formed on the heat-resistant substrate 1 by CVD or the like, and the n⁺ type polycrystalline silicon film 5b is subjected to zone-melting recrystallization, followed by removal of the cap layer (FIG. 16(a)).

Figure 16B:
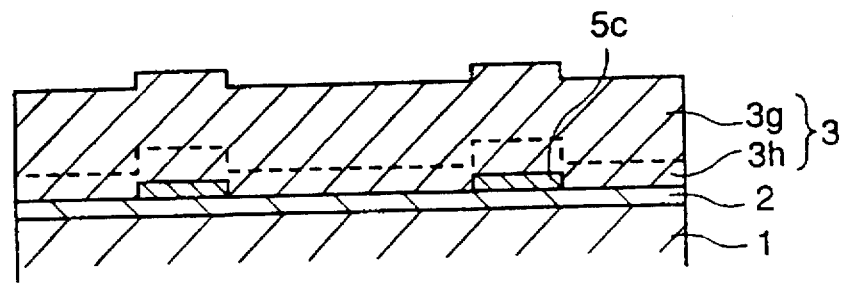

Thereafter, a p type polycrystalline silicon film 3g is epitaxially grown on the n⁺ type polycrystalline silicon film 5b by CVD or the like (FIG. 16(b)). During the epitaxial growth, impurities in the p type polycrystalline silicon film 3g diffuse into the n⁺ type polycrystalline silicon film 5b, and the n⁺ type polycrystalline silicon film 5b excluding portions 5c opposite the projection, is converted to a p type polycrystalline silicon film 3h. These p type polycrystalline silicon films 3g and 3h correspond to the semiconductor film 3 of the previously described embodiments.

Figure 16C:
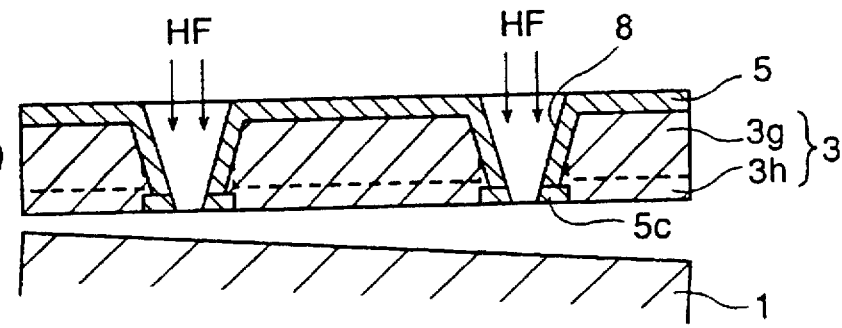
Figure 16D:
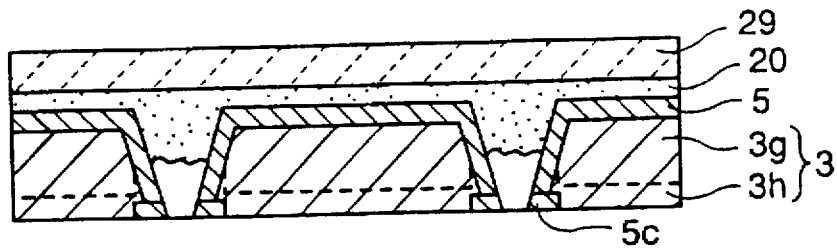

In the step of FIG. 16(c), a plurality of holes 8 are formed penetrating through the p type polycrystalline silicon films 3g and 3h and the n⁺ type polycrystalline silicon film 5c so that the n⁺ type polycrystalline silicon film 5c remains in the vicinity of the bottom of each through-hole 8. Thereafter, an n type impurity dopant is diffused from the upper surface of the p type polycrystalline silicon film 3g to form a junction 5 at the upper surface of that film 3g and the internal surface of the through-holes 8. Then, this wafer is immersed in hydrofluoric acid to completely etch away the intermediate film 2 through the through-holes 8, whereby the semiconductor film 3 is separated from the substrate 1.

Thereafter, an anti-reflection film (not shown) is formed on the surface of the p type polycrystalline silicon film 3g, and the surface covered with the anti-reflection film is adhered to a glass plate 29 via transparent adhesive 20. (FIG. 16(d)).

Figure 16E:
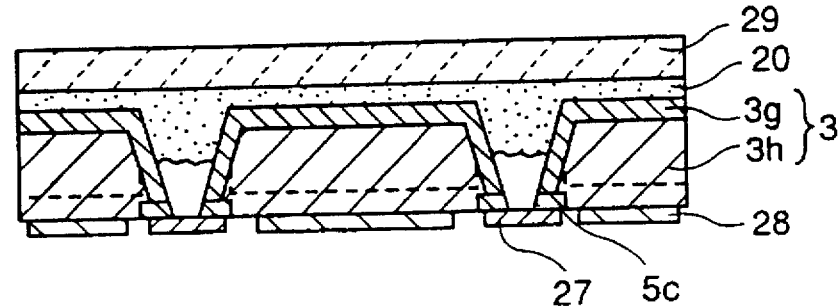

Finally, first electrodes (n side electrodes) 27 are produced in contact with the n⁺ type polycrystalline film 5c, and second electrodes (p side electrodes) 28 are produced in contact with the p type polycrystalline silicon film 3g, using different masks, whereby a thin film solar cell is completed (FIG. 16(e)).

In the above-described production process, the same effects as in the ninth embodiment of the invention are achieved. In addition, patterning of the n⁺ type junction layer, i.e., the n⁺ type polycrystalline silicon film 5c, after the separation of the semiconductor film 3 from the substrate 1 is dispensed with, whereby the production process is simplified compared to the process of the ninth embodiment.

In the thin film solar cell fabricated in the above-described production process, as in the above-described ninth embodiment, the first electrodes 27 are in contact with the highly-doped n⁺ type polycrystalline silicon film 5c, so that an improved ohmic contact is achieved between them, resulting in higher output power from the solar cell.

In the previously described first to tenth embodiments, the grid electrodes 6 and the n side electrodes 27 are produced by printing a desired pattern of silver paste. Thereafter, the patterned silver paste is baked at 500° C. or more to reduce the contact resistance between the electrodes and the semiconductor film, whereby the ohmic contact between them is improved. However, in the seventh to tenth embodiments where the electrodes are produced after adhering the semiconductor film to a glass plate using a transparent adhesive, the baking of silver paste at 500° C. or more reduces the transparency of the resin contained in the transparent adhesive. This results in a decrease in incident solar light on the semiconductor film serving as a power generating layer of the solar cell.

This problem is solved in the eleventh and twelfth embodiments of the invention described hereinafter.

Figure 17:
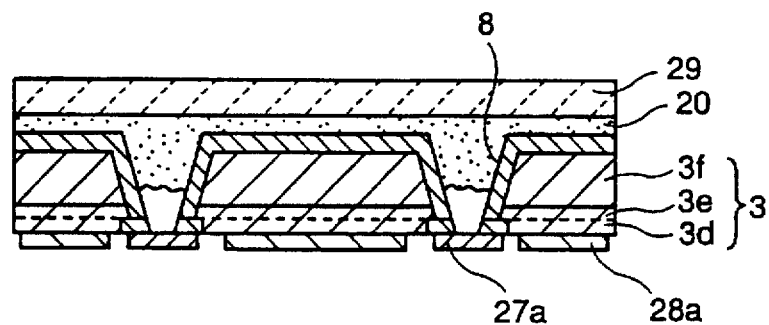
FIG. 17 is a sectional view illustrating a thin film solar cell in accordance with an eleventh embodiment of the present invention.

FIG. 17 is a sectional view of a thin film solar cell in accordance with an eleventh embodiment of the present invention. In the figure, the same reference numerals as in FIGS. 14(a)–14(e) designate the same or corresponding parts. Reference numeral 27a designates n side electrodes comprising Ti/Ag, and numeral 28a designates p side electrodes comprising Ti/Ag.

Figure 18:
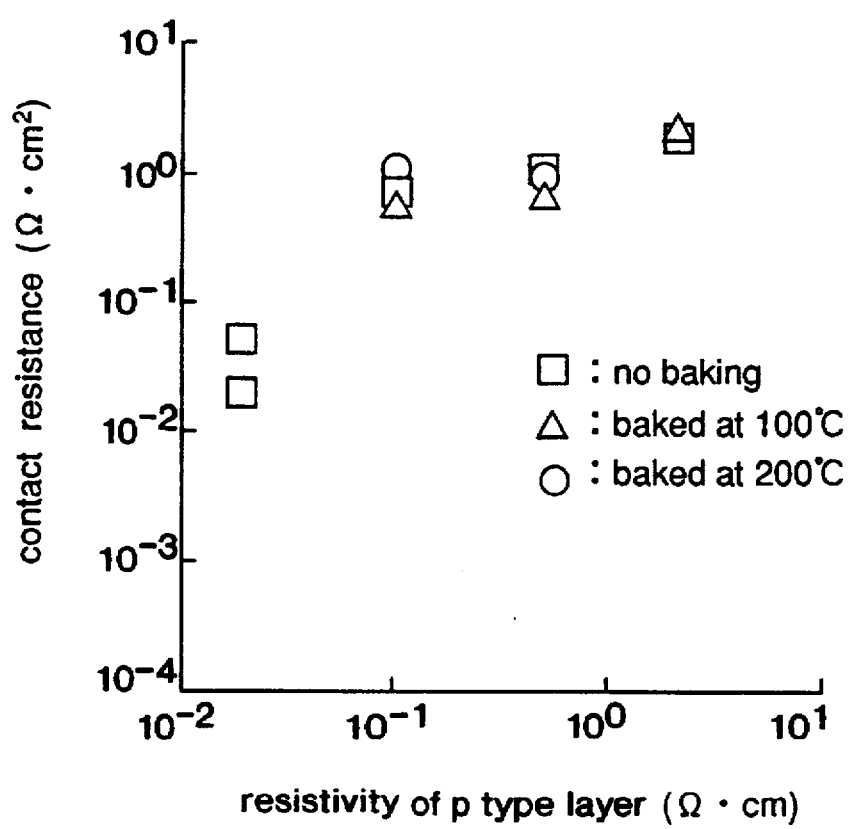
FIG. 18 is a graph illustrating the relationship between the resistivity of a p type layer and the contact resistance between the p type layer and a Ti/Ag electrode.

FIG. 18 is a graph illustrating the relationship between resistivity ($\Omega$·cm) of a p type layer (p type polycrystalline silicon film ) and contact resistance ($\Omega$·cm) between a Ti/Ag electrode and the p type layer. Although Ti/Ag is known as an n side electrode material, when Ti/Ag is in contact with a p⁺ type layer having a high dopant concentration, on the order of $10^{-12}$ $\Omega$·cm, the contact resistance between them can be reduced to the order of $10^{-12}$ $\Omega$·cm without baking the Ti/Ag electrode, as shown in FIG. 18.

The production process of a thin film solar cell according to this eleventh embodiment is fundamentally similar to that already described with respect to FIGS. 14(a)–14(e) according to the eighth embodiment except that the n type electrodes 27a and the p type electrodes 28a both comprising Ti/Ag are simultaneously produced on the surface of the n type junction layer 5 and the surface of the p⁺ type polycrystalline silicon film 3d, respectively, according to the characteristics of the Ti/Ag electrode shown in FIG. 18. The production process of these electrodes 27a and 28a will be described in more detail. That is, a Ti/Ag film is deposited on the lower surface of the semiconductor film 3, using an appropriate mask pattern, by vacuum deposition or sputter deposition, and the mask pattern and overlying portion of the Ti/Ag are removed by the lift-off technique. Alternatively, a Ti/Ag film is deposited over the lower surface of the semiconductor film 3 by vacuum deposition or sputter deposition and patterned by conventional photolithography and etching techniques.

In the above-described production method, since the n side and p side electrodes 27a and 28a comprising Ti/Ag are produced simultaneously in the same process without baking these electrodes, the electrode production process is simplified and the production time is reduced, whereby the production cost is reduced. In addition, the transparency of the transparent adhesive 20 is no lowered by the baking of electrode metal as in the above-described tenth embodiment, so that solar light is incident on the semiconductor film 3 with high efficiency.

Figure 19:
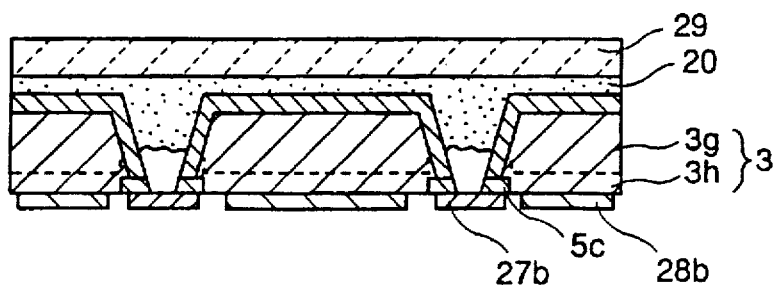
FIG. 19 is a sectional view illustrating a thin film solar cell in accordance with a twelfth embodiment of the present invention.

FIG. 19 is a sectional view illustrating a thin film solar cell in accordance with a twelfth embodiment of the present invention. In the figure, the same reference numerals as in FIGS. 16(a)–16(e) designate the same or corresponding parts. N side electrodes comprising Al are disposed in contact with the n⁺ type polycrystalline silicon film 5c at the lower surface of the semiconductor film 3, and p side electrodes 28b comprising Al are disposed on the lower surface of the semiconductor film 3, i.e., in contact with the p type polycrystalline silicon film 3h.

It is generally known that Al is usable as a p side electrode material. In this twelfth embodiment of the invention, it is found that the contact resistance between an Al electrode and an n⁺ type polycrystalline silicon film having a sheet resistance of 60 $\Omega$/cm² is on the order of or lower than $10^{-2}$ $\Omega$·cm² and, according to this fact, Al is used for both of the n side and p side electrodes 27b and 28b. More specifically, an unbaked Al electrode provides a contact resistance of $1.1 \times 10^{-2}$ $\Omega$·cm², an Al electrode baked at 100° C. provides a contact resistance of $8.0 \times 10^{-3}$ $\Omega$·cm², and an Al electrode baked at 200° C. provides a contact resistance of $4.9 \times 10^{-3}$ $\Omega$·cm².

Figure 20:
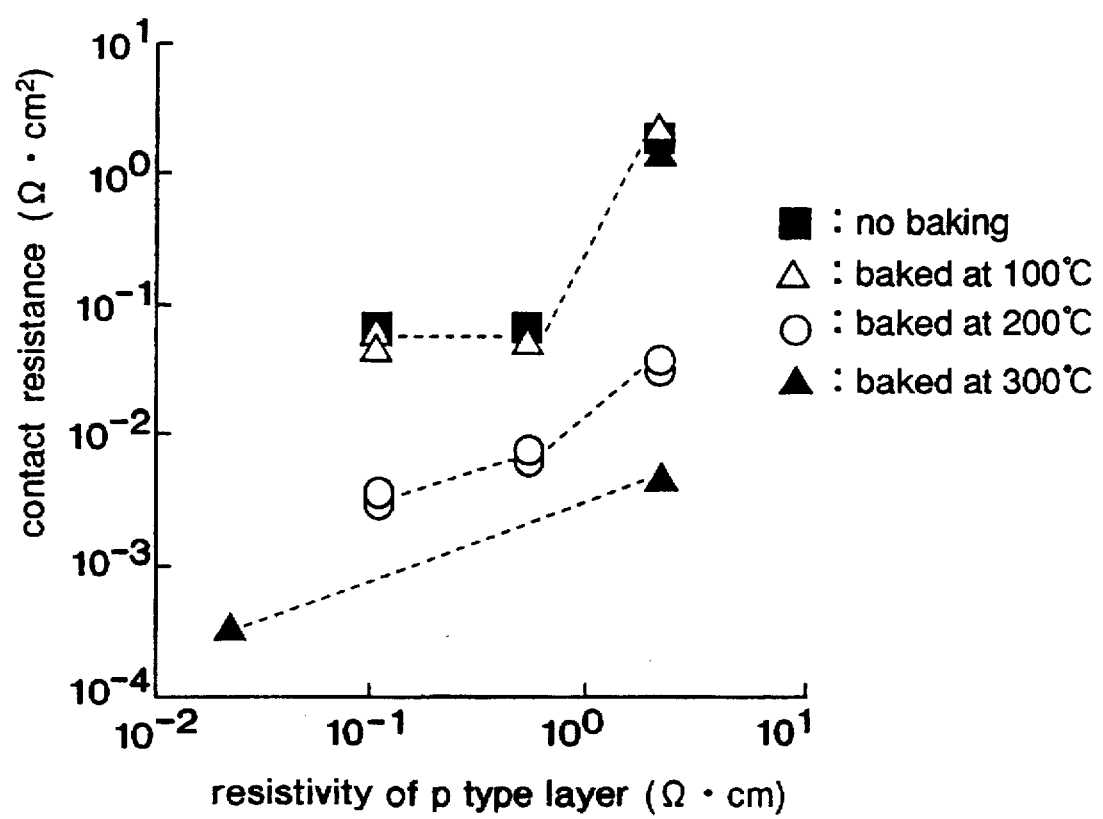
FIG. 20 is a graph illustrating the relationship between the resistivity of a p type layer and the contact resistance between the p type layer and an Al electrode.

FIG. 20 is a graph illustrating relationship between resistivity ($\Omega$·cm) of a p type layer (p type polycrystalline silicon film) and contact resistance ($\Omega$·cm²) between an Al electrode and the p type layer. Although it is generally known that the contact resistance between an Al electrode and a p type layer is relatively small, when the Al electrode is baked at a temperature lower than 300° C., the contact resistance is further reduced to the order of $10^{-3}$ $\Omega$·cm², as shown in FIG. 20.

The production process of the solar cell shown in FIG. 19 is fundamentally similar to that already described with respect to FIGS. 16(a)–16(e) except that the n side electrodes 27b and the p side electrodes 28b both comprising Al are simultaneously produced in the same process step according to the characteristics of the Al electrode shown in FIG. 20. The electrode production process will be described in more detail. That is, an Al film is deposited on the rear surface of the semiconductor film 3, i.e., then n$^+$ type polycrystalline silicon film 5c and the p type polycrystalline silicon film 3h, by vacuum deposition or sputter deposition and patterned by conventional photolithography and etching techniques, followed by baking of the electrode pattern at a temperature lower than 300° C., preferably 100°~200° C.

In the above-described production method, since both of the n side electrode 27b and the p side electrode 28b are produced using Al in the same process, the electrode production process is simplified compared to that of the above-described tenth embodiment, resulting in reductions in the production time and production cost. Further, in the thin film solar cell produced as described above, the n side and p side electrodes 27b and 28b are in contact with the semiconductor film data low contact resistance on the order of or lower than $10^{-3}$ $\Omega \cdot cm^2$, so that an improved ohmic contact is achieved between them, resulting in a higher output power than that of the solar cell of the tenth embodiment. Furthermore, since the transparency of the transparent adhesive 20 is not lowered in the baking process at a temperature lower than 300° C., solar light is incident on the semiconductor film 3 with high efficiency.

In the thin film solar cells fabricated by the production methods according to the above-described fifth to twelfth embodiments, since the mechanical strength of the semiconductor film 3 serving as a power generating layer is poor, the semiconductor film 3 is adhered to the glass plate 29 using the transparent adhesive 20. In the fifth embodiment shown in FIGS. 9(a)-9(g), the electrodes 27 and 28 are formed on the semiconductor film 3 after the separation of the semiconductor film 3 from the substrate 1, and the semiconductor film 3 with those electrodes is adhered to the glass plate 29. On the other hand, in the sixth to twelfth embodiments, the semiconductor film 3 separated from the substrate 1 is adhered to the glass plate. 29 and, thereafter, the electrodes are formed on the semiconductor film 3. The handling of the thin semiconductor film 3 is easier in the latter process than in the former process. In the latter process, however, the transparent adhesive sometimes protrudes, through the through-holes 8, from the lower surface of the semiconductor film 3 where electrodes are to be produced, resulting in imperfect connection between the electrodes and the semiconductor film.

The process steps of adhering the thin semiconductor film 3 to the glass plate 29 in the sixth to twelfth embodiments of the invention are illustrated in FIGS. 21(a)-21(d). In these figures, the same reference numerals as in FIGS. 13(a)-13(f) designate the same or corresponding parts. Reference numerals 3i and 3j designate a light incident surface and an electrode formation surface of the semiconductor film 3, respectively. The junction region 5 produced in the semiconductor film 3 is omitted.

Figure 21A:
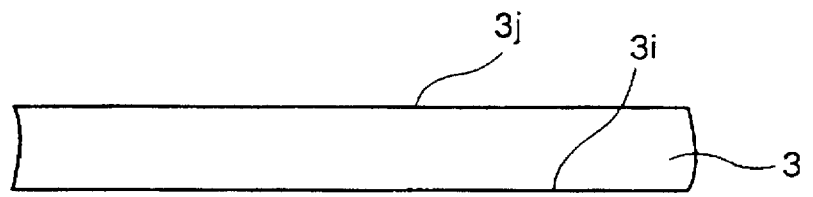
FIGS. 21(a)–21(d) are sectional views illustrating process steps for adhering a thin semiconductor film to glass substrate according to the sixth to twelfth embodiments of the present invention.
Figure 21B:
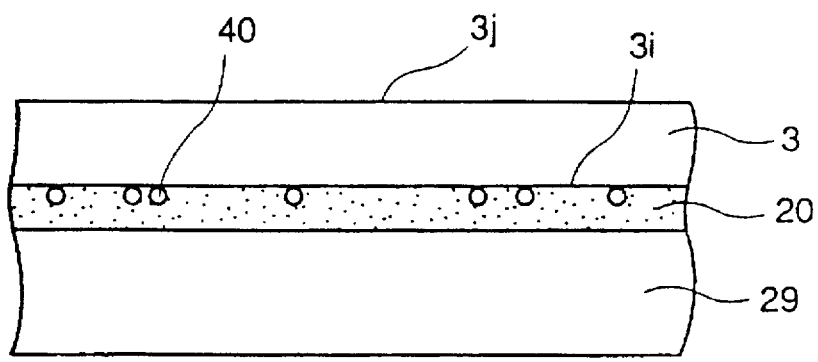
Figure 21C:
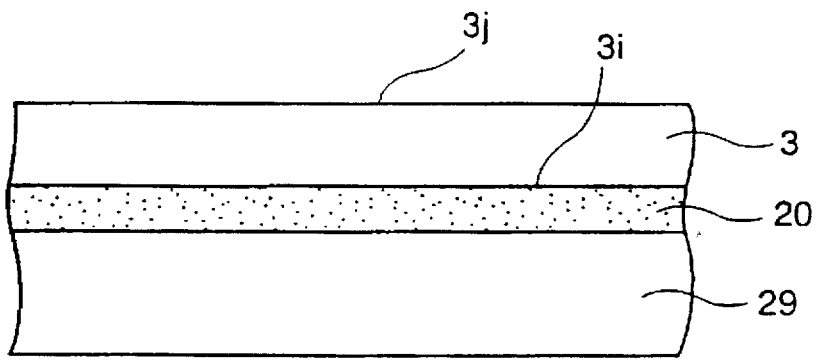
Figure 21D:
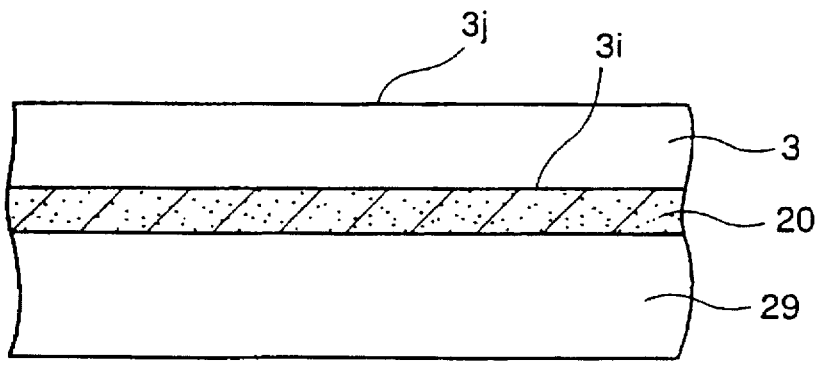

Initially, a prescribed quantity of transparent adhesive 20 is applied to the glass plate 29 (FIG. 21(a)). Thereafter, the semiconductor film 3 is disposed on the transparent adhesive 20 with the light incident surface 3i in contact with the adhesive (FIG. 21(b)). Then, a vacuum is produced to remove air bubbles 40 produced in the adhesive 20 at the time of its application (FIG. 21(c)). If the air bubbles 40 remain in the adhesive 20 of a completed solar cell, the quantity of solar light incident on the solar cell is reduced by the air bubbles 40. In this process, the glass plate 29 and the semiconductor film 3 are pressed toward the transparent adhesive 20 at a pressure of about 1 atm. Thereafter, the wafer is heated at a prescribed temperature for a prescribed time to thermally harden the transparent adhesive 20, whereby the semiconductor film 3 is firmly adhered to the glass plate 29 via the transparent adhesive 20.

Figure 22:
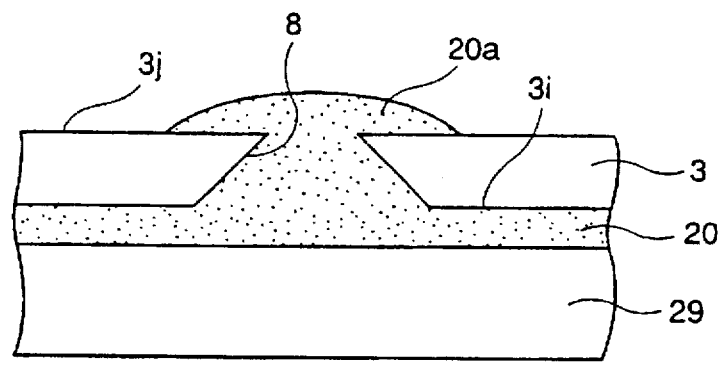
FIG. 22 is a sectional view for explaining a problem in the step shown in FIG. 21(c).

FIG. 22 is an enlarged view of a par of the semiconductor film 3 adhered to the glass plate 29 in the vicinity of the through-hole 8. When the glass plate 29 and the semiconductor film 3 are pressed toward the transparent adhesive 20 at about 1 atm in the step of FIG. 21(c), the transparent adhesive 20 sometimes spreads onto the electrode formation surface 3j of the semiconductor film 3 through the through-hole 8. The reason is as follows. That is, since the transparent adhesive 20 is a gel at room temperature, it is difficult to control the quantity of the adhesive 20 when it is applied to the glass plate 29. If the adhesive 20 is applied over the entire surface of the glass plate 29 to obtain adequate adhesion, the applied quantity increases spontaneously. Therefore, when the glass plate 29 and the semiconductor film 3 are pressed toward the adhesive 20, the intermediate adhesive 20 enters into the through-hole 8 and a portion 20a of the adhesive spreads on the electrode formation surface 3j of the semiconductor film 3.

This problem is solved in the thirteenth to nineteenth embodiments of the invention described hereinafter.

Figure 23A:
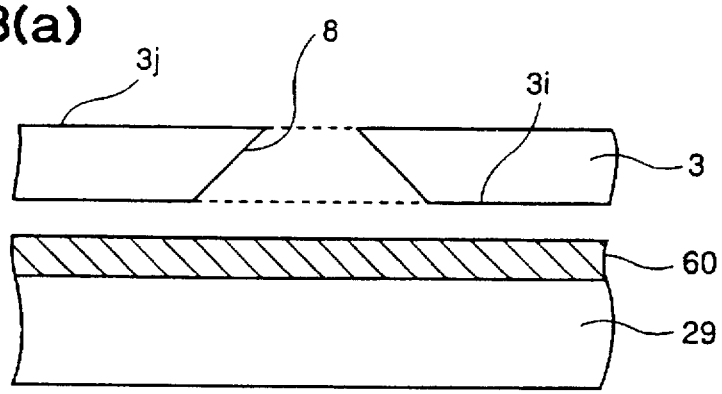
FIGS. 23(a) and 23(b) are sectional views illustrating process steps for adhering a thin semiconductor film to a glass substrate in accordance with a thirteenth embodiment of the present invention.
Figure 23B:
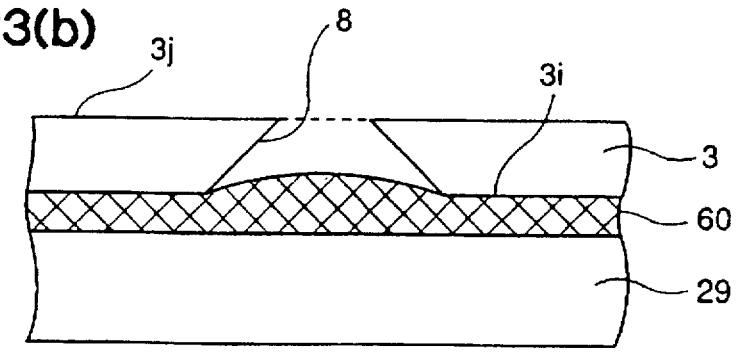

FIGS. 23(a) and 23(b) are sectional views for explaining a process of adhering a thin semiconductor film to a glass plate in accordance with a thirteenth embodiment of the present invention. In these figures, the same reference numerals as in FIGS. 21(a)-21(d) designate the same or corresponding parts. Reference numeral 60 designates a sheet of adhesive comprising a resin with high transparency that is softened by heating. The adhesive sheet has a viscosity exceeding 10,000 P (poise) when it is softened and, thereafter, it is hardened immediately.

Initially, the adhesive sheet 60 is disposed on the glass substrate 29, and the semiconductor film 3 is disposed on the adhesive sheet 60 (FIG. 23(a)). Thereafter, the glass plate 29 and the semiconductor film 3 are pressed toward the intermediate adhesive sheet 60 at a pressure of one atmosphere and heated at a temperature exceeding the softening point of the adhesive sheet 60 for a prescribed time. During the heating process, the adhesive sheet 60 is softened and adhered to the upper surface of the glass plate 29 and to the lower surface of the semiconductor film 3. Thereafter, the adhesive sheet is hardened, whereby the semiconductor film 3 is fixed to the glass substrate 29 (FIG. 23(b)). Since the adhesive sheet 60 has a high viscosity, exceeding 10,000 P when it is softened, the shape of the sheet is maintained. To complete the solar cell, electrodes are produced on the surface 3j of the semiconductor film 3. As an example of the adhesive sheet, SOTEFA (silicone optically transparent elastomer adhesive) produced by TORAY DOWCORNING SILICONE CO. LTD. is employed. When this SOTEFA is heated at 130° C. for 20~30 minutes, it is thermally hardened immediately after it is softened.

In the above-described production method, the shape of the adhesive sheet 60 interposed between the glass plate 29 and the semiconductor film 3 is maintained even then it is heated, so that it hardly protrudes from the opening of the through-hole 8 at the electrode formation surface 3j of the semiconductor film 3 when the glass plate 29 and the semiconductor film 3 are pressed toward the adhesive sheet 60. Therefore, electrodes are produced on the surface 3j of the semiconductor film 3 in perfect physical and electrical contact with that surface.

Figure 24A:
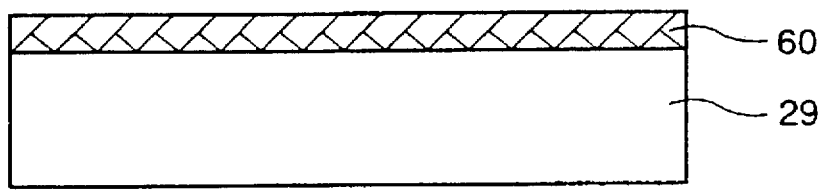
FIGS. 24(a)–24(c) are sectional views illustrating process steps for adhering a thin semiconductor film to a glass substrate in accordance with a fourteenth embodiment of the present invention.
Figure 24B:
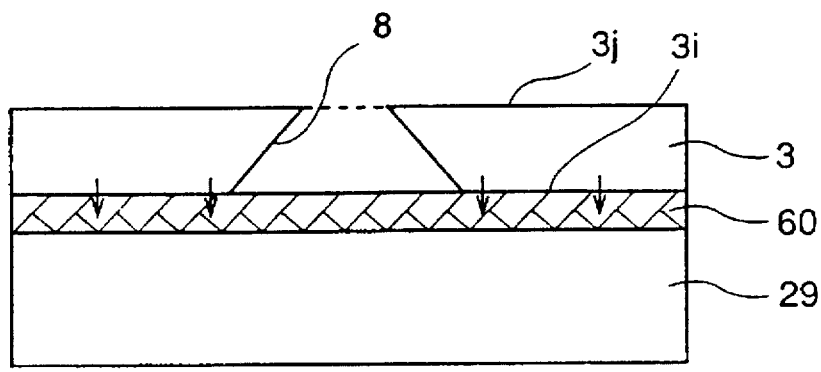
Figure 24C:
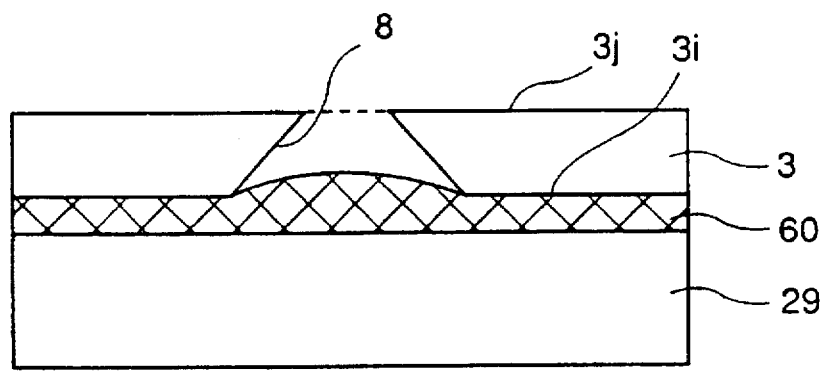

FIGS. 24(a)-24(c) are sectional views for explaining a process of adhering a semiconductor film to a glass plate in accordance with a fourteenth embodiment of the present invention. In the Figures, the same reference numerals as in FIGS. 23(a)–23(b) designate the same or corresponding parts.

Initially, the glass plate 29 is heated to a prescribed temperature and, thereafter, the adhesive sheet 60 as used in the above-described thirteenth embodiment is disposed on the glass plate 29 (FIG. 24(a)). A portion of the adhesive sheet 60 in contact with the heated glass plate is softened and then hardened, whereby the adhesive sheet 60 is fixed to the glass plate 29. After cooling of the adhesive sheet to room temperature, the semiconductor film 3 heated to a prescribed temperature is disposed on the adhesive sheet with the light incident surface 3i in contact with that sheet, and the semiconductor film 3 is pressed against the adhesives sheet 60, as shown in FIG. 24(b). A portion of the adhesive sheet 60 in contact with the light incident surface 3i of the semiconductor film 3 is softened by the heat of the semiconductor film 3 as indicated by the arrows in FIG. 24(b) and then it is hardened, whereby the semiconductor film 3 is fixed to the adhesive sheet 60 (FIG. 24(c)). The temperature to which the glass plate 29 and the adhesive sheet 60 are heated is a temperature at which thermosetting of the adhesive sheet 60 occurs immediately after it is softened. This temperature is above 130° C. when the above-described SOTEFA is employed.

In this production method according to the fourteenth embodiment of the invention when the semiconductor film 3 is adhered to the adhesive sheet 60, the softened portion of the adhesive sheet 60 in contact with the semiconductor film 3 and the hardened portion of that sheet in contact with the glass plate 29 are continuous in molecular level, so that the shape of the adhesive sheet 60 is maintained with high reliability. Therefore, compared to the method according to the above-described thirteenth embodiment, the spreading of the adhesive on the electrode formation surface 3i of the semiconductor film 3 is prevented with higher reliability.

Figure 25:
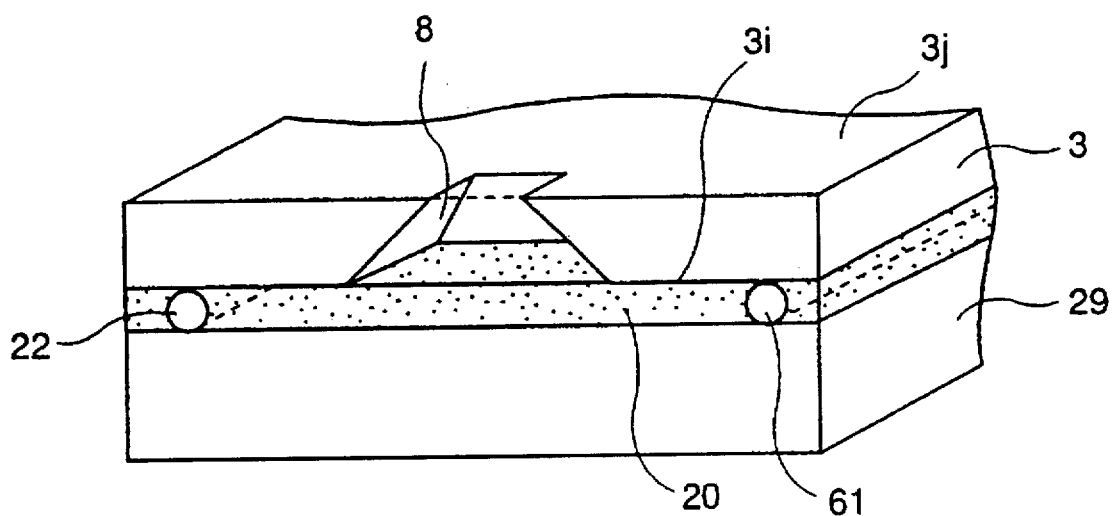
FIG. 25 is a perspective view illustrating a process step of adhering a thin semiconductor film to a glass substrate in accordance with a fifteenth embodiment of the present invention.

FIG. 25 is a sectional view for explaining a process of adhering a semiconductor film to a glass plate in accordance with a fifteenth embodiment of the present invention. In the figure, the same reference numerals as those in FIGS. 21(a)–21(d) designate the same or corresponding parts. Reference numeral 61 designates linear spacers having high transparency and comprising, for example, acrylic resin.

Initially, the linear spacers 61 are disposed at prescribed positions on the glass plate 29, and a transparent adhesive 20 in gel state is applied to the glass plate 29. Thereafter, the semiconductor film 3 is put on the adhesive 20 with the light incident surface 3i in contact with the adhesive. The subsequent processing is identical to that already described with respect to FIGS. 21(a)–21(d) and, therefore, repeated description is not necessary.

In the production method according to the fifteenth embodiment of the invention, since the linear spacers 61 are disposed on the glass plate 29, even when the semiconductor film 3 and the glass plate 29 are pressed against the adhesive 20, the thickness of the adhesive 20 does not become thinner than the height of the linear spacers 61. Therefore, the adhesive 20 is not subjected to an excess pressure that makes the adhesive spread onto the electrode formation surface 3j of the semiconductor film 3 through the though-hole 8. As a result, electrodes are produced on the surface 3j of the semiconductor film 3 in perfect physical and electrical contact with that surface.

Figure 26:
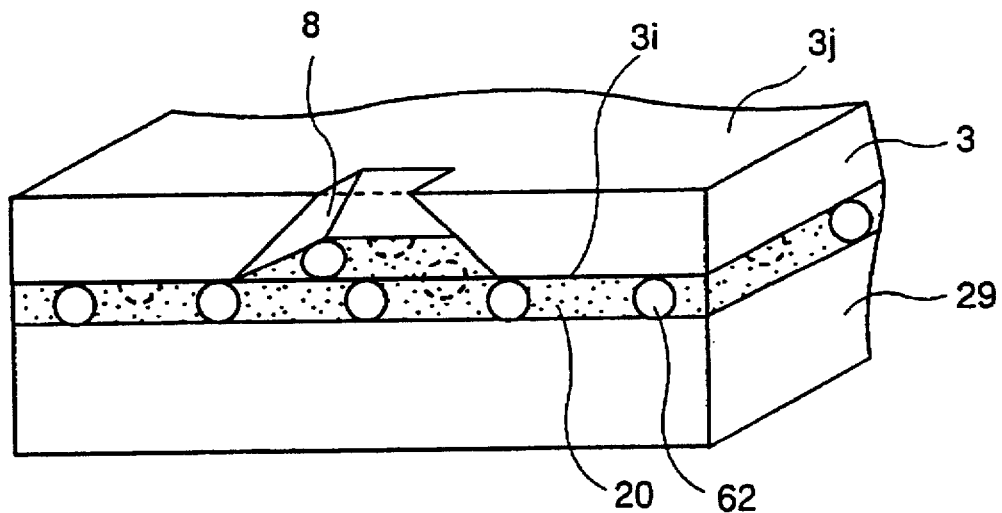
FIG. 26 is a perspective view for explaining a variation of the fifteenth embodiment.

While in the above-described embodiment linear spacers are employed, bead-shaped spacers 62 having high transparency and comprising acrylic resin or the like as shown in FIG. 26 may be employed with the same effects as described above. In this case, the bead-shaped spacers are mixed into the transparent adhesive 20 in advance, and the adhesive containing the bead spacers 26 is applied to the glass plate 29. Therefore, the production efficiency is improved compared to the case using the linear spacers 61.

Figure 27:
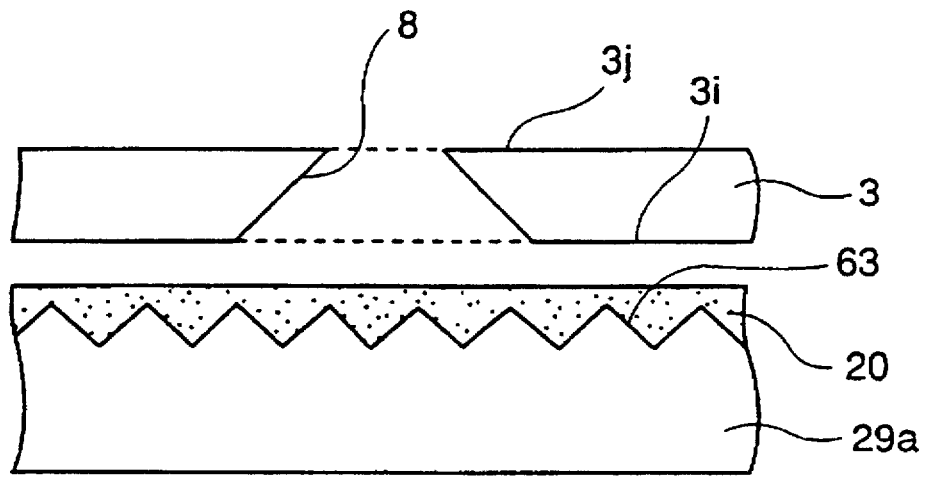
FIG. 27 is a sectional view illustrating a process step of adhering a thin semiconductor film to a glass substrate in accordance with a sixteenth embodiment of the present invention.

FIG. 27 is a sectional view for explaining a process of adhering a semiconductor film to a glass plate in accordance with a sixteenth embodiment of the present invention. In the figure, the same reference numerals as in FIGS. 21(a)–21(d) designate the same or corresponding parts. Reference numeral 29a designates a glass plate having a periodic pattern of stripe-shaped V grooves 63 at the front surface. The width and depth of each V groove 63 are 400 μm and 200 μm, respectively.

The process of adhering the semiconductor film 3 to the glass plate 29a is identical to that already described with respect to FIGS. 21(a)–21(d).

In this production method when the semiconductor film 3 and the glass plate 29a are pressed against the adhesive 20, the adhesive 20 enters into the V grooves 63 of the glass plate 29a, so that the unwanted flow of the adhesive into the through-holes 8 is suppressed. Therefore, the adhesive 20 hardly spreads onto the electrode formation surface 3j of the semiconductor film 3 through the through-holes 8, resulting in perfect contact between the semiconductor film 3 and electrodes.

Figure 28:
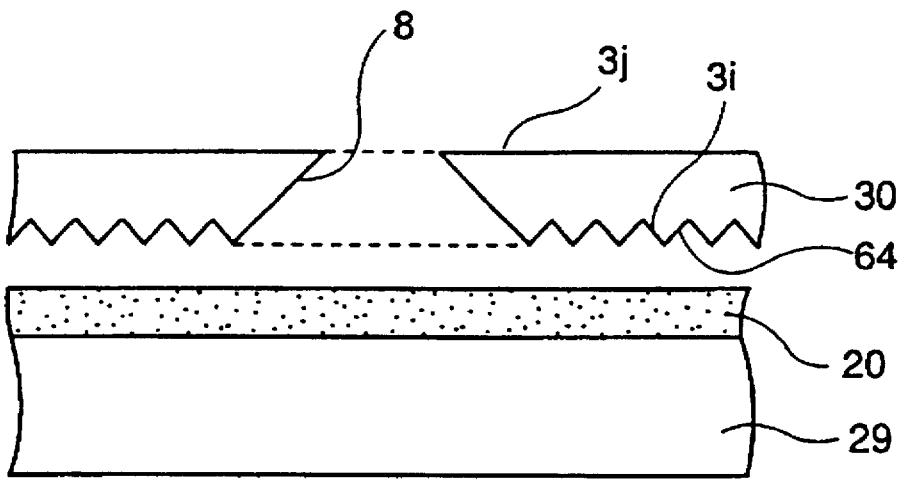
FIG. 28 is a sectional view illustrating a process step of adhering a thin semiconductor film to a glass substrate in accordance with a seventeenth embodiment of the present invention.

FIG. 28 is a sectional view for explaining a process of adhering a semiconductor film to a glass plate in accordance with a seventeenth embodiment of the present invention. In the figure, the same reference numerals as in FIGS. 21(a)–21(d) designate the same or corresponding parts. Reference numeral 30 dsignates a semiconductor film having a periodic pattern of stripe-shaped V grooves 64 at its light incident surface 3i. The depth of the V grooves 64 is 10 μm.

The process of adhering the semiconductor film 30 to the glass plate 29 is identical to that already described with respect to FIGS. 21(a)–21(d).

In this production method, when the semiconductor film 30 and the glass plate 29 are pressed against the adhesive 20, the adhesive 20 enters into the V grooves 64 of the semiconductor film 30, so that the unwanted flow of the adhesive into the through-holes 8 is suppressed. Therefore, the adhesive 20 hardly spreads onto the electrode formation surface 3j of the semiconductor film 3 through the through-hole 8, resulting in perfect contact between the semiconductor film 3 and electrodes.

Figure 29:
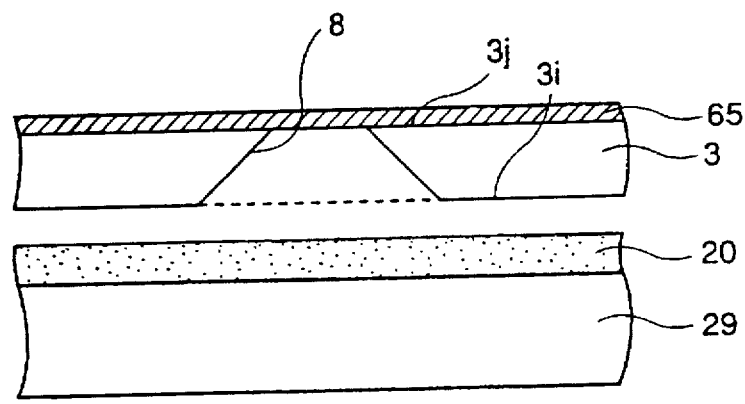
FIG. 29 is a sectional view illustrating a process step of adhering a thin semiconductor film to a glass substrate in accordance with an eighteenth embodiment of the present invention.

FIG. 29 is a sectional view for explaining a process of adhering a semiconductor film to a glass plate in accordance with an eighteenth embodiment of the present invention. In the figure, the same reference numerals as in FIGS. 21(a)–21(d) designate the same or corresponding parts. Reference numeral 65 designates an adhesive tape adhered to the electrode formation surface 3j of the semiconductor film 3, covering the opening of the through-hole 8 at that surface 3j. Generally known adhesive tape comprising a resin sheet or fabric to which adhesive is applied is employed as the adhesive tape 65.

The process of adhering the semiconductor film 3 to the glass plate 29 is fundamentally similar to that already described with respect to FIGS. 21(a)–21(d) except that the semiconductor film 3 having the adhesive tape 65 at the electrode formation surface 3j is put on the transparent adhesive 20 on the glass plate 29, and the semiconductor film 3 and the glass plate 29 are pressed against the adhesive 20, followed by removal of the adhesive tape 65 and heat curing of the adhesive 20.

In this production process, since the opening of the through-hole 8 is covered with the adhesive tape 65, even when the adhesive 20 is pressed by the semiconductor film 3 and the glass plate 29 and enters into the through-hole 8, the tape 65 prevents the adhesive 20 from spreading onto the electrode formation surface 3j of the semiconductor film 3. There, electrodes are produced on the surface 3j in perfect physical and electrical contact with that surface 3j.

Figure 30A:
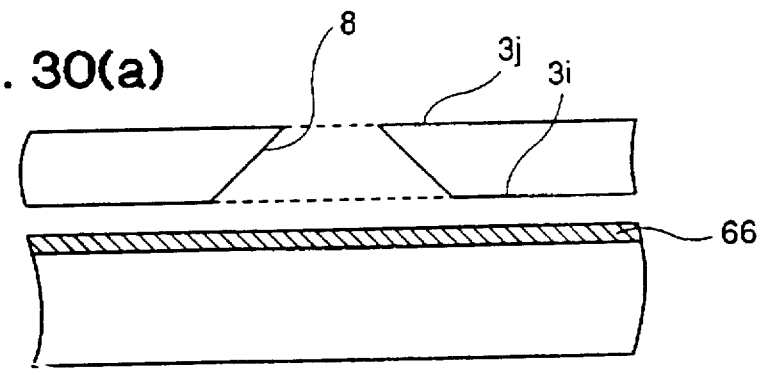
FIGS. 30(a) and 30(b) are sectional views illustrating process steps for adhering a thin semiconductor film to a glass substrate in accordance with a nineteenth embodiment of the present invention.
Figure 30B:
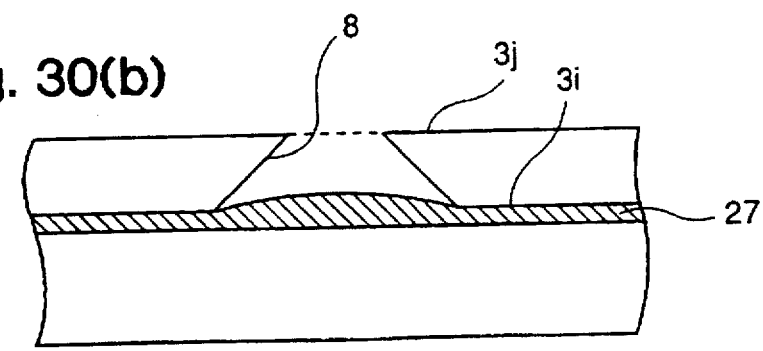
Figure 31A:
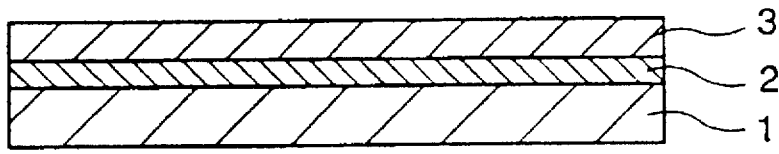
FIGS. 31(a)–31(d) are sectional views illustrating process steps in a method for fabricating a thin film solar cell in accordance with the prior art.
Figure 31B:
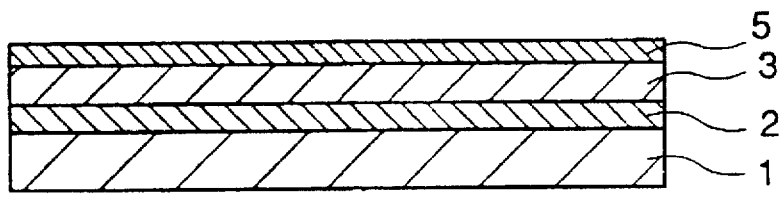
Figure 31C:
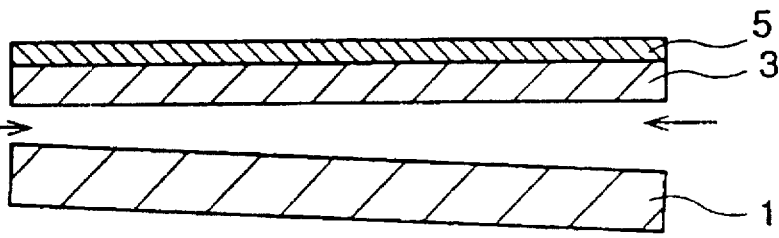
Figure 31D:
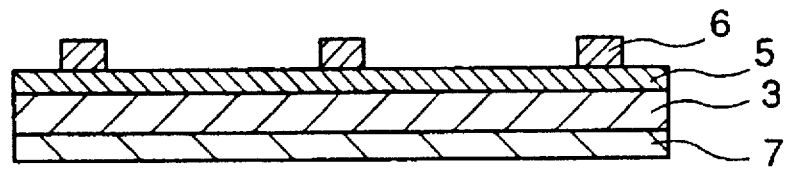
Figure 32A:
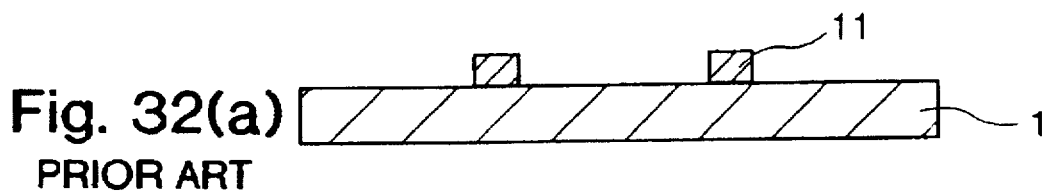
FIGS. 32(a)–32(e) are sectional view illustrating process steps in a method for fabricating a thin film solar cell in accordance with the prior art.
Figure 32B:
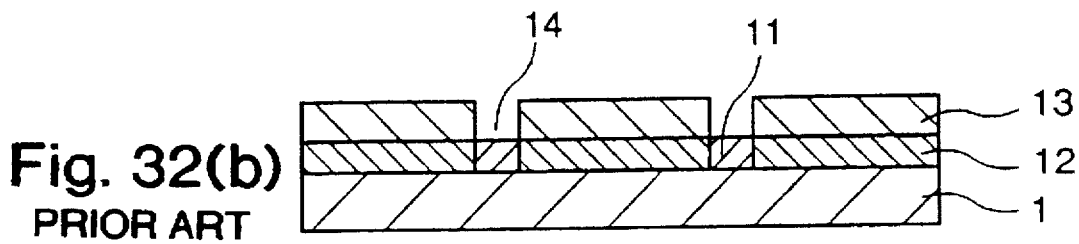
Figure 32C:
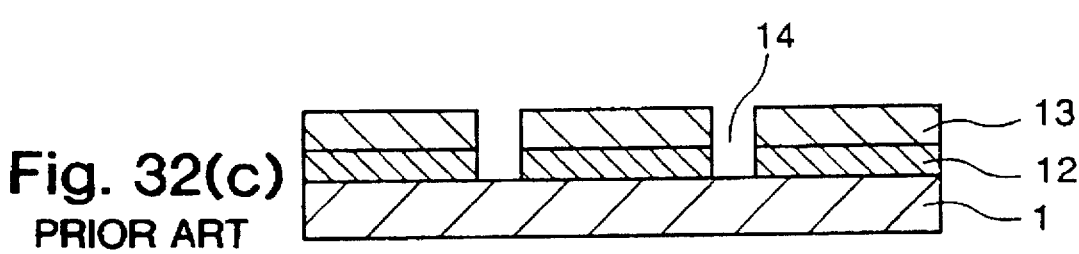
Figure 32D:
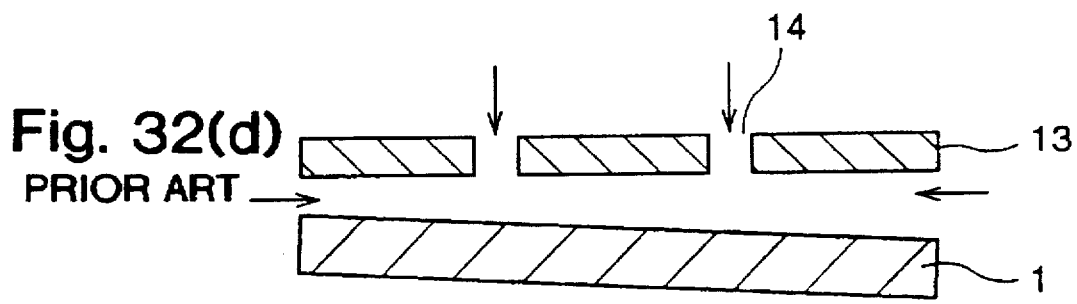
Figure 32E:
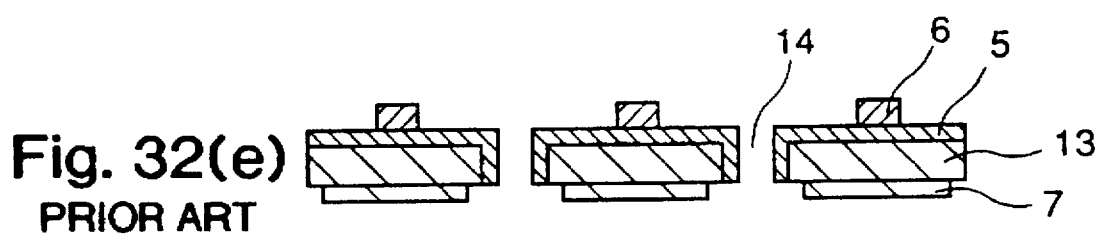
Figure 33:
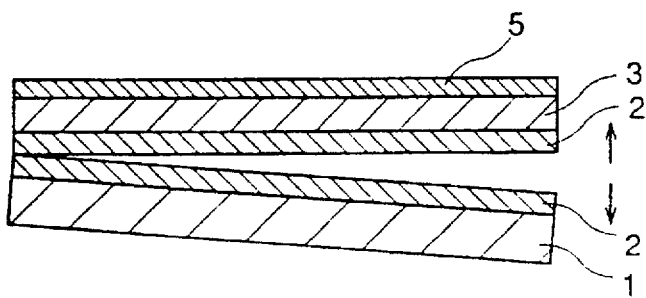
FIG. 33 is a sectional view for explaining a technique of separating a thin semiconductor film from a substrate according to the prior art.
Figure 34:
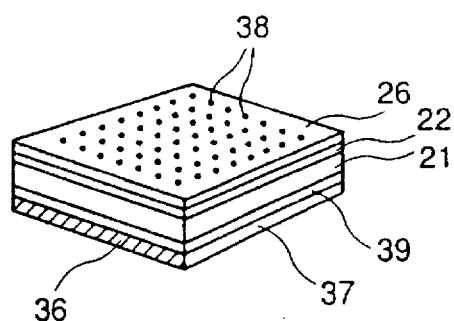
FIG. 34 is a perspective view illustrating a thin film solar cell according to the prior art.
Figure 35:
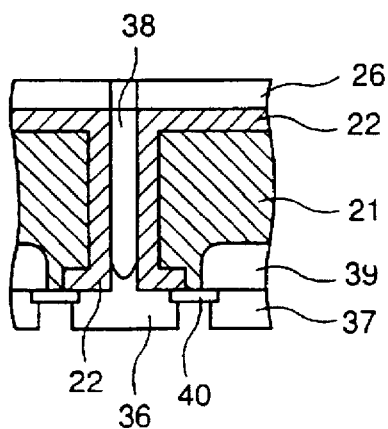
FIG. 35 is a sectional view illustrating a part of a prior art solar cell in the vicinity of a through-hole.

FIGS. 30(a) and 30(b) are sectional views for explaining a process of adhering a semiconductor film to a glass plate in accordance with a nineteenth embodiment of the present invention. In the figures, the same reference numerals as in FIGS. 21(a)–21(d) designate the same or corresponding parts. Reference numeral 66 designates a transparent adhesive having a viscosity lower than 15 P.

Initially, the transparent adhesive 66 is evenly applied to the entire surface of the glass plate 29 by spin coating or blade coating, and the semiconductor film 3 is put on the adhesive 66 with the light incident surface 3i in contact with the adhesive (FIG. 30(a)). Thereafter, the glass plate 29 and the semiconductor film 3 are pressed against the intermediate adhesive 66 and, in this state, the whole structure is heated to a temperature at which the adhesive 66 is cured, whereby the semiconductor film 3 is fixed to the glass plate 29 (FIG. 30(b)). Thereafter, electrodes are formed on the electrode formation surface 3j of the semiconductor film 3.

The adhesive 66 applied to the glass plate 29 must be in sufficient quantity to connect the semiconductor film 3 and the glass plate 29 firmly as well as to prevent the adhesive 66 from protruding onto the electrode formation surface 3j through the through-hole 8. This quantity depends on the area and thickness of the semiconductor film 3 and the size and number of the through-holes 8. For example, when the area and thickness of the semiconductor film 3 are 10 cm² and 100 μm, respectively, and the through-hole 8 is a truncated quadrangular pyramid in shape having a 240 μm² opening at the light incident surface 3i and 100 μm² opening at the electrode formation surface 3j, and the array pitch of the through-holes 8 in the semiconductor film 3 is 1 mm, adhesive 66 thinner than 10 μm satisfies the above-described conditions. When the thickness of the adhesive 66 is less than 1 μm, even when all of the adhesive enters into the through-holes 8, since the volume of the adhesive 66 is smaller than the total volume of trough-holes 8, the adhesive 66 never spreads onto the electrode formation surface 3j. Even in this case, the glass plate 29 and the semiconductor film 3 are firmly connected.

Examples of transparent adhesive having a viscosity lower than 15 P are as follows: CY52-276 (trade name of TORAY BOW CORNING SILICONE CO. LTD.), TSE3033 (trade name of TOSHIBA SILICONE CO. LTD.), TES3250 (trade name of TOSHIBA SILICONE CO. LTD.), and SEMICOSIL932 (trade name of WACKER CHEMICALS CO. LTD.). These are transparent liquid adhesives containing at least one of polyphenylsilsesquioxane, vinylpolydimethylsiloxane, and hydrodienepolydimethylsiloxane.

In the production method according to the nineteenth embodiment of the invention, since the low-viscosity adhesive 66 is employed, the quantity of the adhesive 66 applied to the glass plate 29 can be easily controlled so that the adhesive 66 connects the semiconductor film 3 and the glass plate 29 with reliability without spreading onto the electrode formation surface 3j through the through-holes 8. Therefore, electrodes can be produced on that surface 3j in perfect physical and electrical contact with the semiconductor film 3.

While in the above-described first to nineteenth embodiments the semiconductor film 3 comprises polycrystalline silicon, it may comprise amorphous silicon. The amorphous silicon film is obtained when a silicon film is grown by CVD at a low temperature.

While in the above-described first to twelfth embodiments a monocrystalline silicon wafer is employed as the heat-resistant substrate 1, the heat-resistant substrate 1 may comprise ceramic, refractory metal, quartz glass, or sapphire, or these materials coated with carbon, SiC, or boron nitride. Alternatively, a heat resistantant coating or a chemical resistant coating may be applied to the surface of the heat-resistant substrate 1 to improve the resistance of the substrate to the etching process or the thermal process and to increase the number of available uses of the reusable substrate.

While in the above-described first to twelfth embodiments the zone-melting recrystallization of the semiconductor film 3 is carried out using a carbon strip heater, other heat sources, such as laser light and a flame, may be used.

While in the above-described first to twelfth embodiments the semiconductor film 3 is subjected to zone-melting recrystallization to improve the crystalline quality of that film, the zone-melting recrystallization may be omitted according to the desired performance of the solar cell. If the semiconductor film 3 is produced by solid-phase growth that provides good crystalline quality of the grown film, the zone-melting recrystallization process is not necessary.

While in the above-described first to twelfth embodiments the intermediate layer 2 is removed with an liquid etchant, it maybe removed by other techniques, for example, dry etching.

While in the above-described first to nineteenth embodiments the semiconductor film 3 comprises silicon, the present invention may be applied to other cases where the semiconductor film 3 comprises compound semiconductors, such as GaAs, CdTe, or CuInSe$_2$.

What is claimed is:

1. A method for fabricating a thin film solar cell including a thin semiconductor film serving as a power generating layer, said method including:

forming a thin semiconductor film on an intermediate layer disposed on a heat resistant substrate, said thin semiconductor film having a first surface in contact with the intermediate layer and a second surface opposite the first surface;

forming a plurality of through holes penetrating through the thin semiconductor film and reaching the intermediate layer; and etching the intermediate layer through the through-holes to separate the thin semiconductor film from the heat resistant substrate.

2. The method of claim 1 including:

after separation of the thin semiconductor film from the heat resistant substrate, forming a junction region at the first and second surfaces of the thin semiconductor film and at internal surfaces of the through-holes;

selectively removing portions of the junction region at one of the first and second surfaces of the thin semiconductor film, leaving portions of the junction region in the vicinity of the through-holes; and forming first and second electrodes on the surface of the thin semiconductor film where the junction region is partially removed and in electrical contact with the remaining portions of the junction region.

3. The method of claim 2 including:

preparing a transparent substrate having a surface covered with a sheet of adhesive comprising a transparent resin, said transparent resin having a viscosity exceeding 10,000 Poise when it is softened by heat and being hardened immediately after the thermal softening;

before formation of the electrodes, disposing the thin semiconductor film on the adhesive sheet so that one of the first and second surfaces where electrodes are not to be produced is in contact with the adhesive sheet; and heating the transparent substrate, the adhesive sheet, and the thin semiconductor film to a temperature higher than the softening temperature of the adhesive sheet while pressing the transparent substrate and the thin semiconductor film toward the adhesive sheet.

4. The method of claim 2 including:

preparing a transparent substrate and a sheet of adhesive comprising a transparent resin having a viscosity exceeding 10,000 Poise when it is softened by heat and being hardened immediately after the thermal softening;

before formation of the electrodes, disposing the adhesive sheet on the transparent substrate that is heated to a temperature exceeding the softening point of the adhesive sheet; and after cooling the transparent substrate, pressing the thin semiconductor film that is heated to a temperature higher than the softening temperature of the adhesive sheet against the adhesive sheet so that one of the first and second surfaces where electrodes are not to be produced is in contact with the adhesive sheet to fix the thin semiconductor film on the transparent substrate via the adhesive sheet.

5. The method of claim 2 including:

disposing spacers on a transparent substrate and applying a thermosetting transparent adhesive over the substrate;

before formation of electrodes, disposing the thin semiconductor film on the transparent adhesive so that one of the first and second surfaces where electrodes are not to be produced is in contact with the transparent adhesive; and heating the transparent substrate, transparent adhesive, and thin semiconductor film to a temperature higher than the thermosetting temperature of the transparent adhesive while pressing the transparent substrate and the thin semiconductor film toward the transparent adhesive.

6. The method of claim 2 including:

preparing a transparent substrate having a surface including a periodic pattern of stripe-shaped grooves;

applying a thermosetting transparent adhesive to the surface of the substrate;

before formation of electrodes, disposing the thin semiconductor film on the transparent adhesive so that one of the first and second surfaces where electrodes are not to be produced is in contact with the transparent adhesive; and heating the transparent substrate, transparent adhesive, and thin semiconductor film to a temperature higher than the thermosetting temperature of the transparent adhesive while pressing the transparent substrate and the thin semiconductor film toward the transparent adhesive.

7. The method of claim 2 including:

preparing a transparent substrate having a surface covered with a thermosetting transparent adhesive;

before formation of electrodes, forming a periodic pattern of stripe-shaped grooves on one of the first and second surfaces of the thin semiconductor film where electrodes are not to be produced;

disposing the thin semiconductor film on the transparent adhesive, with the surface having the stripe-shaped grooves in contact with the transparent adhesive; and heating the transparent substrate, transparent adhesive, and thin semiconductor film to a temperature higher than the thermosetting temperature of the transparent adhesive while pressing the transparent substrate and the thin semiconductor film toward the transparent adhesive.

8. The method of claim 2 including:

preparing a thermosetting transparent substrate having a surface covered with a transparent adhesive;

before formation of electrodes, applying an adhesive tape to one of the first and second surfaces of the semiconductor film where electrodes are to be produced, covering openings of the through-holes;

disposing the thin semiconductor film on the transparent adhesive with the surface opposite the surface having the adhesive tape in contact with the transparent adhesive;

applying pressure to the transparent substrate and the thin semiconductor film toward the transparent adhesive;

removing the adhesive tape from the thin semiconductor film; and heating the transparent substrate, transparent adhesive, and thin semiconductor film to a temperature higher than the thermosetting temperature of the transparent adhesive while applying the pressure.

9. The method of claim 2 including:

applying a thin film of a thermosetting transparent adhesive having a viscosity lower than 15 Poise evenly on a surface of a transparent substrate;

disposing the thin semiconductor film on the transparent adhesive so that one of the first and second surfaces where electrodes are not to be produced is in contact with the adhesive; and heating the transparent substrate, transparent adhesive, and thin semiconductor film to a temperature higher than the thermosetting point of the transparent adhesive while pressing the transparent substrate and the thin semiconductor film toward the transparent adhesive.

10. The method of claim 1 including:

after formation of the through-holes, etching portions of the intermediate layer in the vicinity of the through-holes and forming a plurality of junction regions at the second surface of the thin semiconductor film, at internal surfaces of the through-holes, and at portions of the first surface of the thin semiconductor film exposed by the removal of the intermediate layer; and after separation of the thin semiconductor film from the substrate, forming a plurality of electrodes on the first surface of the thin semiconductor film with each electrode in electrical contact with a junction region.

11. The method of claim 10 further including:

forming the thin semiconductor film with a high dopant impurity concentration region at the first surface; and forming first and second electrodes comprising the same electrode metal simultaneously on the first surface of the thin semiconductor film so that the first electrodes are in electrical contact with the junction region and the second electrodes are in electrical contact with the high dopant impurity concentration region.

12. The method of claim 1 further including:

forming the thin semiconductor film by successively forming a first semiconductor film of a first conductivity type and a second semiconductor film of a second conductivity type, opposite the first conductivity type, on the intermediate layer, said first semiconductor film serving as a junction forming layer;

after formation of the through-holes, forming junction regions at the second surface of the thin semiconductor film and at internal surfaces of the through-holes; and after separation of the thin semiconductor film from the substrate, etching the first semiconductor film leaving remaining portions in the vicinity of the through-holes, and forming electrodes in contact with the remaining portions of the first semiconductor film.

13. The method of claim 12 further including:

forming the first conductivity type first semiconductor film with a high dopant impurity concentration; and forming first and second electrodes comprising the same electrode metal simultaneously on the first surface of the thin semiconductor film so that the first electrodes are in electrical contact with the remaining portions of the first semiconductor film and second electrodes are in electrical contact with the second semiconductor film.

14. The method of claim 1 including:

producing the thin semiconductor film by successively forming a first semiconductor film of a first conductivity type having thick portions through which the through-holes are to be produced and a second semiconductor film of a second conductivity type, opposite the first conductivity type, on the intermediate layer so that portions of the first semiconductor film beneath the thick portions remain the first conductivity type while other portions are converted to the second conductivity type, said first conductivity type portions of the first semiconductor film serving as junction regions; and after formation of the through-holes, forming junction regions at heat resistant second surface of the thin semiconductor film and at the internal, surfaces of the through-holes; and after separation of the thin semiconductor film from the substrate, forming electrodes on the first surface of the thin semiconductor film, in electrical contact with the junction regions.

15. The method of claim 14 including:

forming the first conductivity type first semiconductor film with a high dopant impurity concentration; and forming first and second electrodes comprising the same electrode metal simultaneously on the first surface of the thin semiconductor film so that the first electrodes are in electrical contact with remaining first conductivity type portions of the first semiconductor film and second electrodes are in electrical contact with the portions of the first semiconductor film converted to the second conductivity type.

16. The method of claim 1 including:

forming a thin polycrystalline silicon film as the thin semiconductor film; and zone-melting and recrystallizing the thin polycrystalline silicon film.

17. The method of claim 1 including:

forming a first silicon oxide film as the intermediate layer, a thin polycrystalline silicon film as the thin semiconductor film, a second silicon oxide film, and a silicon nitride film successively on the substrate; and zone-melting and recrystallizing the thin polycrystalline silicon film.

18. A method for fabricating a thin film solar cell including a thin semiconductor film serving as a power generating layer, said method including:

preparing a heat resistant substrate including a plurality of through-holes at respective positions;

forming an intermediate layer on the substrate so that the through-holes are covered with the intermediate layer, and forming thin semiconductor film on the intermediate layer; and etching the intermediate layer through the through-holes to separate the thin semiconductor film from the heat resistant substrate.

19. A method for fabricating a thin film solar cell including a thin semiconductor film serving as a power generating layer, the method including:

preparing a heat resistant substrate including a plurality of through-holes at respective positions;

successively forming an intermediate layer and a thin semiconductor film on the heat resistant substrate so that the through-holes of the heat resistant substrate are not covered by the intermediate layer and thin semiconductor film, said thin semiconductor film having a first surface in contact with the intermediate layer and a second surface opposite the first surface; and etching the intermediate layer through the through-holes penetrating the heat resistant substrate, the intermediate layer, and the thin semiconductor film to separate the thin semiconductor film from the heat resistant substrate.

20. The method of claim 19 including:

after separating the thin semiconductor film from the heat resistant substrate, forming a junction region at the first and second surfaces of the thin semiconductor film and at internal surfaces of the through-holes;

selectively removing portions of the junction region at one of the first and second surfaces of the thin semiconductor film, leaving portions of the junction region in the vicinity of the through-holes; and forming first and second electrodes on the surface of the thin semiconductor film Where the junction region is partially removed and in electrical contact with the remaining portions of the junction region.

21. The method of claim 19 including:

after formation of the through-holes, etching portions of the intermediate layer in the vicinity of the through-holes and forming a plurality of junction regions at the second surface of the thin semiconductor film, at internal surfaces of the through-holes, and at portions of the first surface of the thin semiconductor film exposed by the removal of the intermediate layer; and after separation of the thin semiconductor film from the substrate, forming a plurality of electrodes on the first surface of the thin semiconductor film with each electrode in electrical contact with a junction region.

22. The method of claim 21 further including:

forming the thin semiconductor film with a high impurity concentration region at the first surface; and forming first and second electrodes comprising the same electrode metal simultaneously on the first surface of the thin semiconductor film so that the first electrodes are in electrical contact with the junction region and the second electrodes are in electrical contact with the high dopant impurity concentration region.

* * * * *